US006947270B2

(12) United States Patent
Gruening

(10) Patent No.: US 6,947,270 B2
(45) Date of Patent: Sep. 20, 2005

(54) BUILDING BLOCK FOR SERIES CONNECTION IN HIGH POWER CONVERTER

(75) Inventor: Horst Gruening, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 385 days.

(21) Appl. No.: 10/366,561

(22) Filed: Feb. 14, 2003

(65) Prior Publication Data

US 2003/0156437 A1 Aug. 21, 2003

(30) Foreign Application Priority Data

Feb. 15, 2002 (JP) ....................................... 2002-038394

(51) Int. Cl.[7] ................................................ H02H 3/20
(52) U.S. Cl. .................................................... 361/91.8
(58) Field of Search ......................... 361/18, 91.7, 91.8

(56) References Cited

U.S. PATENT DOCUMENTS 4,796,146 A * 1/1989 Takahashi .................. 361/91.8
5,544,035 A 8/1996 Beriger et al.
5,946,178 A 8/1999 Bijlenga
2002/0057540 A1 * 5/2002 Ito et al. ....................... 361/18
2002/0118503 A1 8/2002 Gruening et al.

FOREIGN PATENT DOCUMENTS

| | | |
|---|---|---|
| JP | 5-22929 | 1/1993 |
| JP | 5-111262 | 4/1993 |
| JP | 5-276650 | 10/1993 |
| JP | 9-275674 | 10/1997 |

* cited by examiner

*Primary Examiner*—Ronald Leja
(74) *Attorney, Agent, or Firm*—Leydig, Voit & Mayer, Ltd.

(57) ABSTRACT

A converter includes building blocks, each building block being a switching unit. Each building block must be able to receive high power at an elevated switching frequency with low power dissipation in semiconductor switches. The building block includes semiconductor switches and a reactor connected in series, and a series connection of a voltage clamp and a diode. The series connection is connected in parallel to each of the semiconductor switches. The clamps are arranged in such a way that all clamping and voltage control is realised by a clamp connected in parallel with the corresponding semiconductor switch.

20 Claims, 35 Drawing Sheets

3500
VClamp1
2500
3500
0

3000
2500
VClamp2
3500
2500
0

IClamp1

IClamp2

ON
T1
OFF
t1
t3

ON
T2
OFF
t2
t4

6000
Vout
2500
6000
t5

ILORD
ISU
0
ILORD

BUILDING BLOCK FOR SERIES CONNECTION IN HIGH POWER CONVERTER

BACKGROUND OF THE INVENTION

The present invention relates to a high power voltage source converter in particular using series connection of forced turn off semiconductor elements.

Forced commutated high power converters have been realized with gate turn off thyristors (GTOs), gate-controlled thyristors (GCTs), and insulated gate bipolar transistors (IGBTs).

GTOs require strong snubber circuits limiting turn on dl/dt and turn off dV/dt of the semiconductor element. Additionally, GTOs exhibit quite a significant tolerance of control delay time. As a consequence, GTO series connection is difficult. It requires many bulky passive components and results in large converter switching loss.

GCT series connection so far also has been realized using snubber circuits. As a consequence, high efficiency has been achieved at low switching frequency, but applications requiring high switching frequency could not be addressed by such technology.

So far high voltage IGBTs have been the best choice. With a gate drive specially designed for IGBT series connection, the IGBT could be controlled to limit its anode voltage during operation and also to limit dl/dt during turn on. In such way passive power circuits such as snubbers and clamps were nearly omitted.

On the other hand the on-state loss of high voltage IGBTs is significantly higher than the on-state loss of comparable GCTs. With similar switching loss, GCTs therefore can show better performance in standard converter circuits. Moreover, GCTs are more powerful at reduced cost, and gate drive timing is more precise. Basically, GCTs therefore are favourite elements for high power converters.

Japanese Patent No. 3004774 proposes a snubber circuit, which can transfer the energy stored in the snubber capacitors into the reset circuit of anode reactors.

Japanese Patent Laid-open Publication No. Hei-05-111262 proposes a snubber and a zener diode connected in parallel to the anode-cathode terminals of a GTO.

Japanese Patent Laid-open Publication No. Hei-05-276650 connects a clamp in parallel to the drain source terminals of a FET. A chopper controls the clamp voltage.

U.S. Pat. No. 5,544,035 proposes snubber circuits connected in parallel to the anode-cathode terminals of GTOs. Dl/dt limiting reactors are located in alternating order with 2 GTOs. Each of these has a separate reset circuit.

U.S. Pat. No. 5,946,178 discloses different types of clamp circuit, which are connected to the collector-emitter or collector-gate terminals of the power semiconductor.

Japanese Pat. Laid-open Publication No. Hei-9-275674 discloses a clamp with chopper control, which is connected to the anode-cathode terminals of a power semiconductor (IGBT).

A building block for voltage source converters must be found which can handle highest power at elevated switching frequency with low power dissipation in the semiconductors and high converter efficiency. It must have a small number of active and passive power components in order to guarantee high converter reliability. The building block must include voltage clamping and dl/dt control. The building block must be suitable to realize 2 level converters 3 level converters and multilevel converters with and without series connection of such blocks.

In such a block the gate turn off semiconductors must be operated in snubberless clamped turn off mode. Dl/dt control during turn on must be realized by anode reactors. Reset circuits must be provided in parallel to such reactors. Clamp circuits must be arranged in such a way, that all clamping and voltage control tasks are realized by a single clamp per semiconductor switch.

SUMMARY OF THE INVENTION

According to the present invention, a building block for series connection in high power voltage source converters, includes a first semiconductor switch with anti-parallel diode, a reactor, and a second semiconductor switch with anti-parallel diode. The first semiconductor switch, the reactor and the second semiconductor switch are connected in series. The building block further includes a first clamp having a voltage limiting function and a first reset diode, which are connected in series to define a first series circuit. The first series circuit is connected in parallel to the first semiconductor switch. The building block further includes a second clamp having a voltage limiting function and a second reset diode, which are connected in series to define a second series circuit. The second series circuit is connected in parallel to the second semiconductor switch. An energy management element is connected between the first and second clamps.

According to the present invention, a high voltage can be regulated without causing any overload in various circuit elements. Also, the high voltage can be regulated with a simple circuitry. The circuit can be arranged in compact size and small expense. The circuit of the building block, i.e., the switching unit, can take care of high power at elevated switching frequency with low power dissipation in the semiconductors and high converter efficiency. The circuit of the building block has a small number of active and passive power components so that a high converter reliability is obtained. The building block has voltage clamping and dl/dt control. The building block is suitable to realize 2 level converters, 3 level converters and multilevel converters with and without series connection of such blocks.

BRIEF DESCRIPTION OF THE DRAWINGS

FIG. 3 shows a circuit diagram of a switch unit constituting the high power converter of FIG. 1, particularly showing a state when semiconductor switches are turned on.

DETAILED DESCRIPTION OF THE PREFERRED EMBODIMENTS

Figure 1:
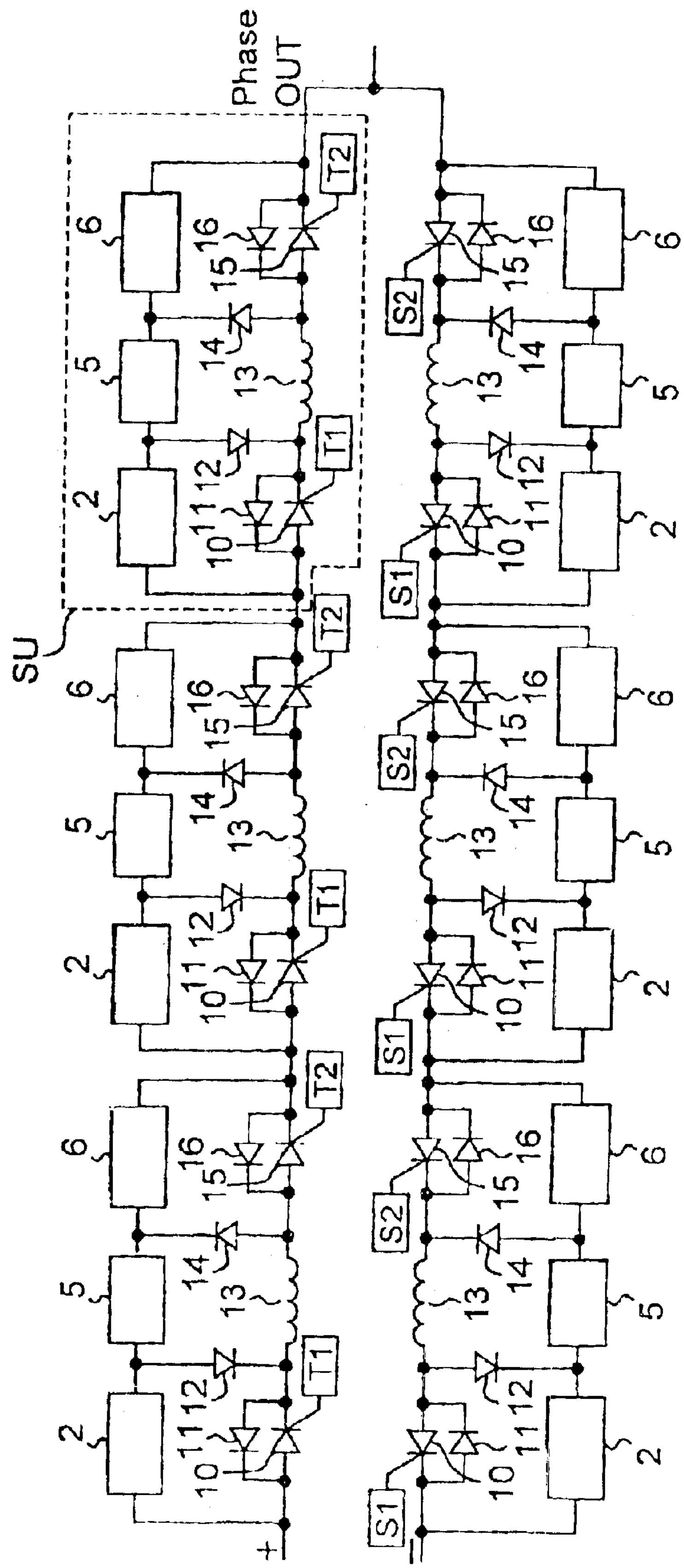
FIG. 1 shows a circuit diagram of a high power converter according to the present invention.

Referring to FIG. 1, a high power converter is shown having six switching units SU, three switching units connected in series in a positive branch and three switching units SU connected in series in a negative branch. Each switching unit SU has two semiconductor switches 10 and 15, each semiconductor switch capable of shutting and transmitting current from a power source (not shown) connected to the left hand side end of the branch line in FIG. 1. The voltages and other figures given herein below are examples, and can be changed according to the design. Each semiconductor switch has an operating voltage of, e.g., 3000V and breakdown voltage of, e.g., 6000V. Thus, the six semiconductor switches connected in series in the positive branch, and six semiconductor switches connected in series in the negative branch, it is possible to regulate 18000V signal ON and OFF of the semiconductor switches 10 and 15 in the positive branch are controlled by control circuit T1 and T2, and ON and OFF of the semiconductor switches 10 and 15 in the negative branch are controlled by control circuit S1 and S2.

Figure 2A:
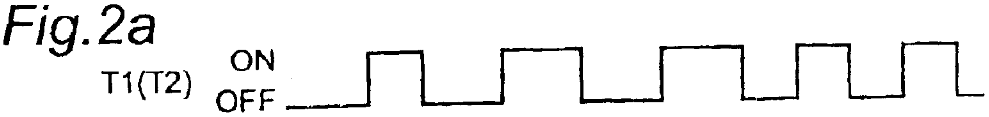
FIGS. 2*a*, 2*b* and 2*c* show waveforms observed in the circuit of FIG. 1, and FIGS. 2*d* and 2*e* show characteristic graph of the first and second clamps, respectively, shown in FIG. 1.
Figure 2B:
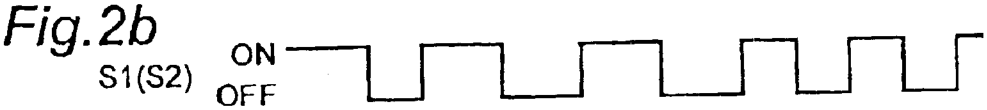
Figure 2C:
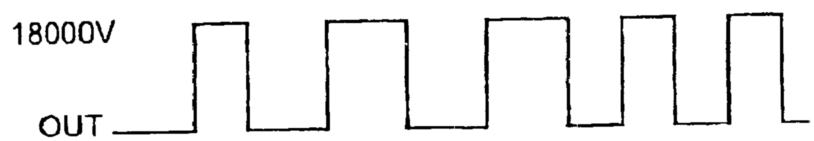
Figures 9A, 9B, 9C, 9D, 9E, 9F, 9G, 9H:
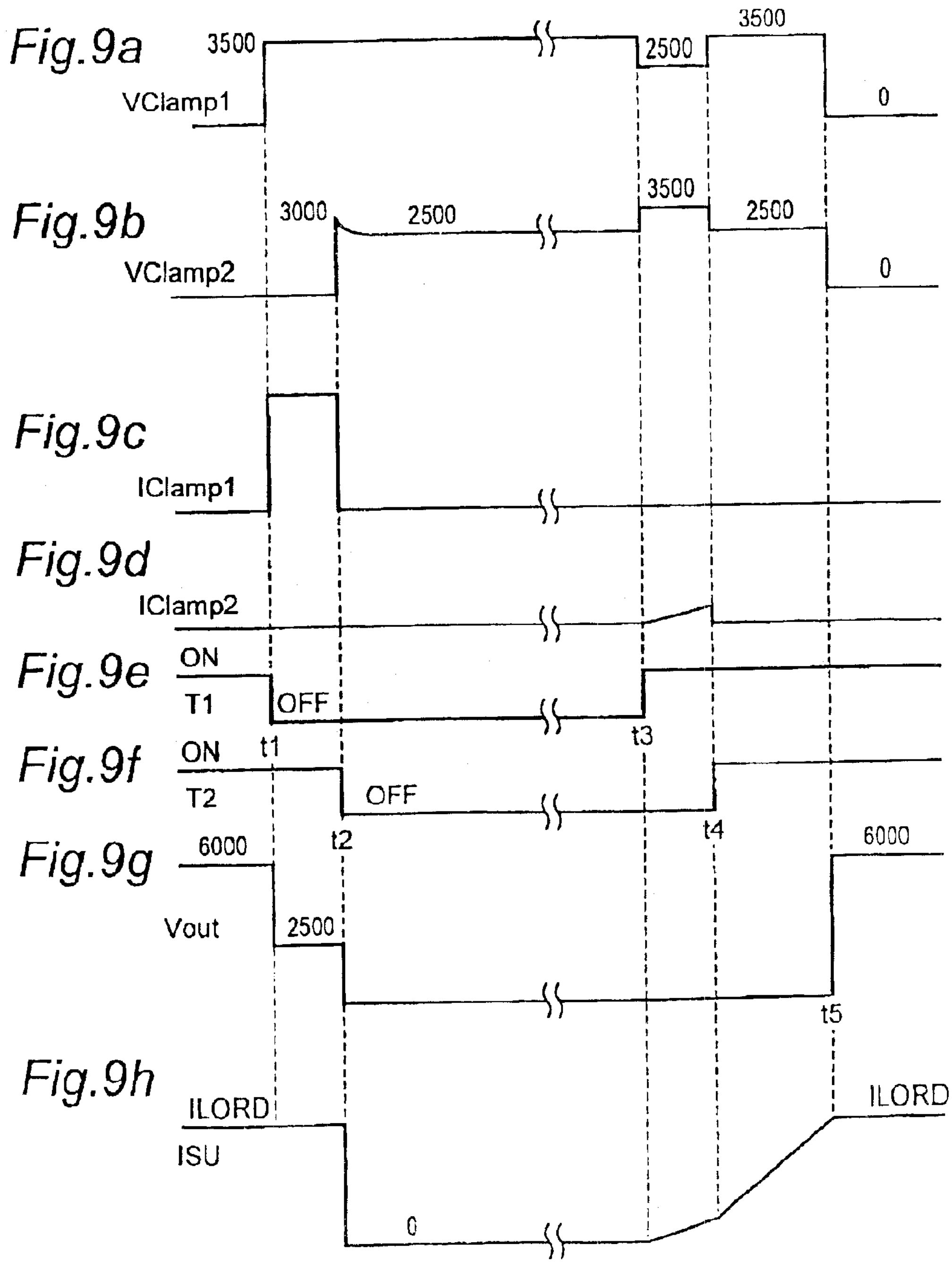
FIG. 9 shows waveforms observed in the switching unit.

As shown in FIG. 2*a*, the operations of the control circuits T1 and T2 are synchronized and have the same phase, and as shown in FIG. 2*b*, the operations of the control circuits S1 and S2 are synchronized and have the same phase, but opposite to those of the control circuits T1 and T2. Thus, by turning ON and OFF the semiconductor switches 10 and 15 as controlled by control circuits T1, T2, S1 and S2, it is possible to produce a pulse signal of very high voltage in the order of, such as thousand, ten thousand or hundred thousand volts, as shown in FIG. 2*c*. Control circuits T1 and T2 produce the control signal in a synchronized manner, but due to various factors, there may be a time difference, such as several 100 ns, as shown in FIG. 9, between turn off time t1 (or turn on time t3) of control circuit T1 and turn off time t2 (or turn on time t4) of control circuit T2. When such time difference occurs, one of the two semiconductor switches 10 and 15 may receive over-breakdown voltage, such as 6000V.

Figure 2D:
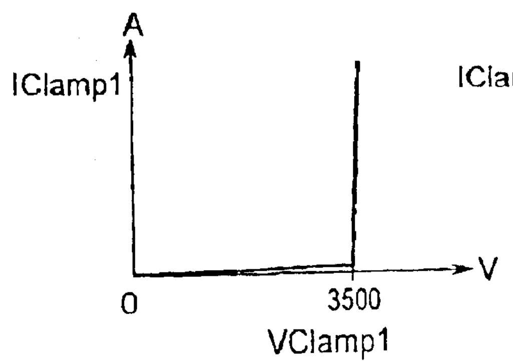
Figure 2E:
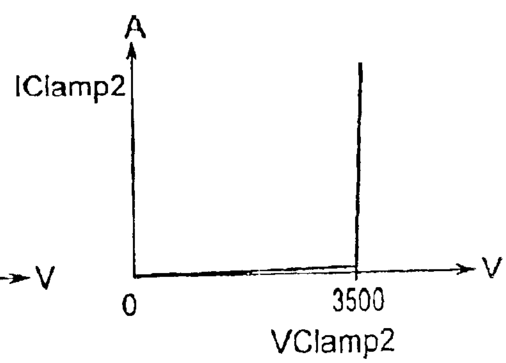

According to the high power converter of the present invention, each switching unit is provided with clamps 2 and 6 for protecting the semiconductor switches 10 and 15, respectively. As shown in FIGS. 2*d* and 2*e*, clamps 2 and 6 hold clamping voltage VClamp1 and VClamp2, respectively, before a conduction current flows therethrough. The VClamp1 or VClamp2 is, for example, 3500V.

Figure 3:
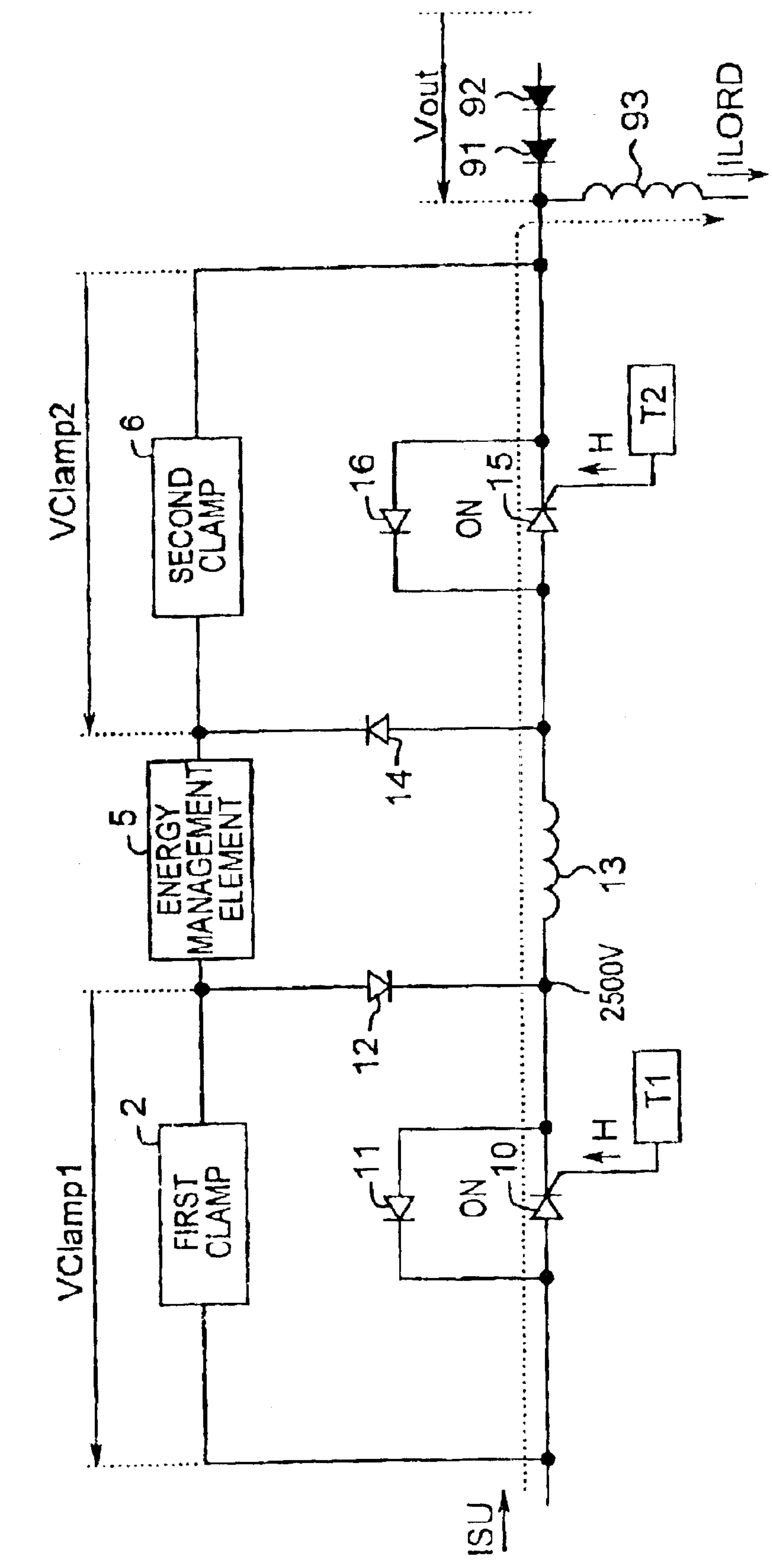

Referring to FIG. 3, a detail of the switching unit SU, also referred to as a building block, is shown. Switching unit SU has a first semiconductor switch 10 and a first anti-parallel diode 11 connected in parallel to the first semiconductor switch 10. ON and OFF of the first semiconductor switch 10 is controlled by control circuit T1. A coil which is referred to as an anode reactor 13 is connected between the cathode of the first semiconductor switch 10 and the anode of the second semiconductor switch 15. Dl/dt control is achieved by anode reactor 13. A series connection (a first series circuit) of a first clamp 2 and a first reset diode 12 is connected in parallel to the first semiconductor switch 10. First clamp 2 has a voltage limiting function. Switching unit SU further has a second semiconductor switch 15 and a second anti-parallel diode 16 connected in parallel to the second semiconductor switch 15. ON and OFF of the second semiconductor switch 15 is controlled by control circuit T2. A series connection (a second series circuit) of a second clamp 6 and a second reset diode 14 is connected in parallel to the second semiconductor switch 15. Second clamp 6 has a voltage limiting function. An energy management element 5 is connected between first clamp 2 and second clamp 6. A reset circuit is defined by first reset diode 12, energy management circuit 5 and second reset diode 14.

A reactor connected to the output of the switching unit SU represents a simplified circuit of a switching unit SU connected in a positive branch. Also, two diodes connected in series at the output of the switching unit SU represent a load.

In the switching unit SU shown in FIG. 3, the dI/dt at simultaneous turn on of the semiconductor switches 10 and 15 is controlled by anode reactor 13. At turn off, the circuit containing the second reset diode 12, the energy management element 5 and the first reset diode 14 resets the anode reactor 13. The first clamp 2 limits the blocking voltage of the first semiconductor switch 10; the second clamp limits the blocking voltage of the second semiconductor switch 15.

A detail of the turn off operation of the switching unit SU is described below with reference to FIGS. 3, 4, 5 and 9. In FIG. 9, before time t1, control circuits T1 and T2 produce a H (high level signal). Thus, as shown in FIG. 3, first and second semiconductor switches 10 and 15 are ON (conductive state) to allow current to flow through switches 10 and 15 to the output reactor.

Figure 4:
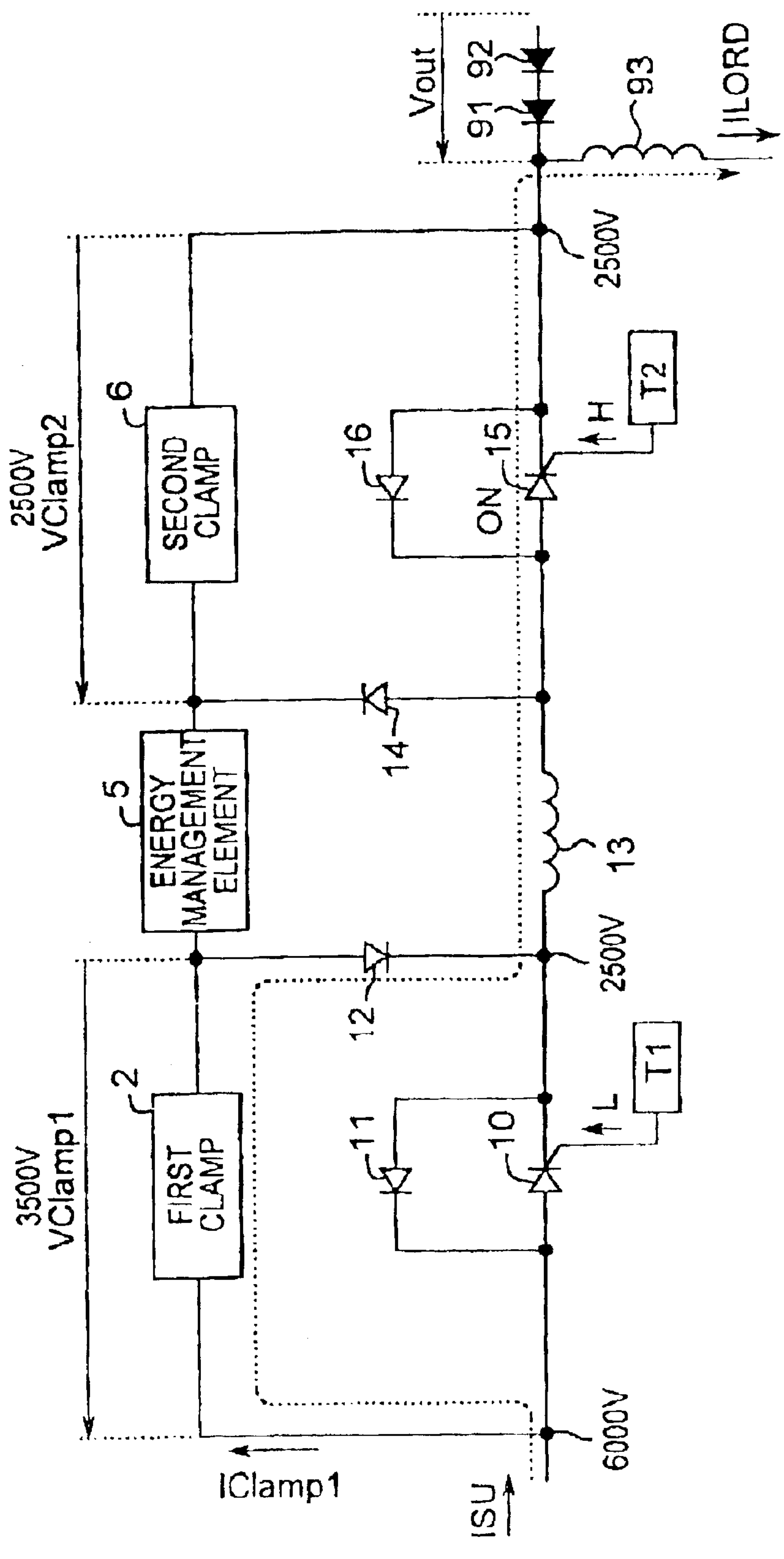
FIG. 4 is similar to FIG. 3, and showing the switch unit, which is being changed to the off state, and particularly showing a state when the first semiconductor switch turns off first.

Then, at time t1, control circuit T1 produces a L (low level signal). This state is shown in FIG. 4. In response to the L from control circuit T1, the switch 10 turns OFF (non conductive state) to flow a bypass current IClamp1 through the first clamp 2. The pass of the bypass current is shown by a dotted line in FIG. 4. Since the first clamp 2 is designed to hold 3500V, 2500V will appear at the output of the first clamp 2.

Figure 5:
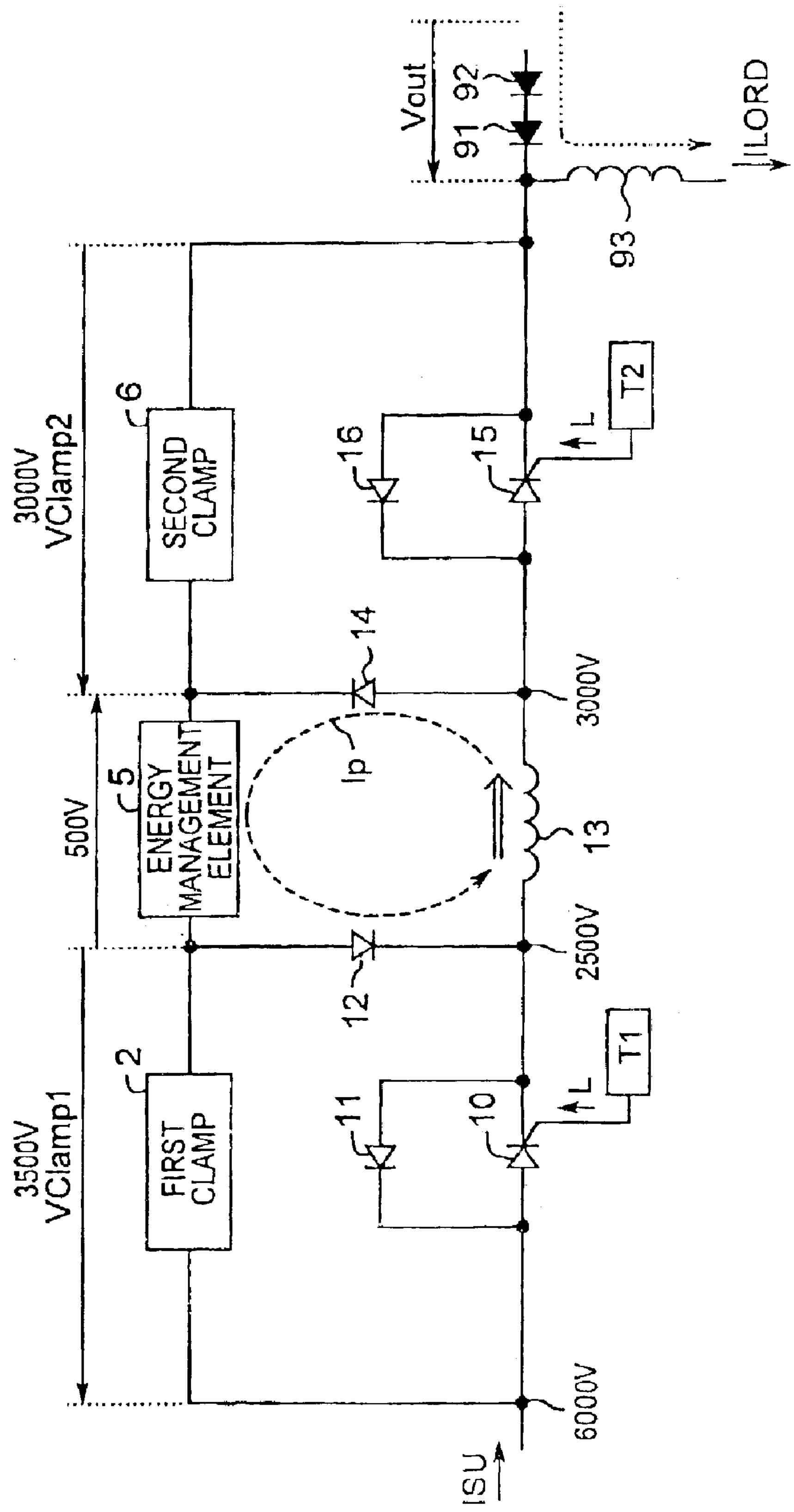
FIG. 5 is similar to FIG. 3, and showing the switch unit, which is being changed to the off state, and particularly showing a state when the second semiconductor switch turns off second.

Then, at time t2, control circuit T2 produces a L. This state is shown in FIG. 5. In response to the L from control circuit T2, the switch 15 turns OFF to completely cut off the current from the power source. In response to the turn off of switches 10 and 15, energy cumulated in reactor 13 is dissipated after the turn off of switch 15 by a loop current lp, shown in FIG. 5. By the loop current lp, a voltage, such as 500V is generated across energy management element 5. When the loop current lp disappears, the voltage 500V across energy management element 5 also disappears. Time t1 and t2 should preferably be the same time, but may be delayed, such as in 100 ns.

Figure 6:
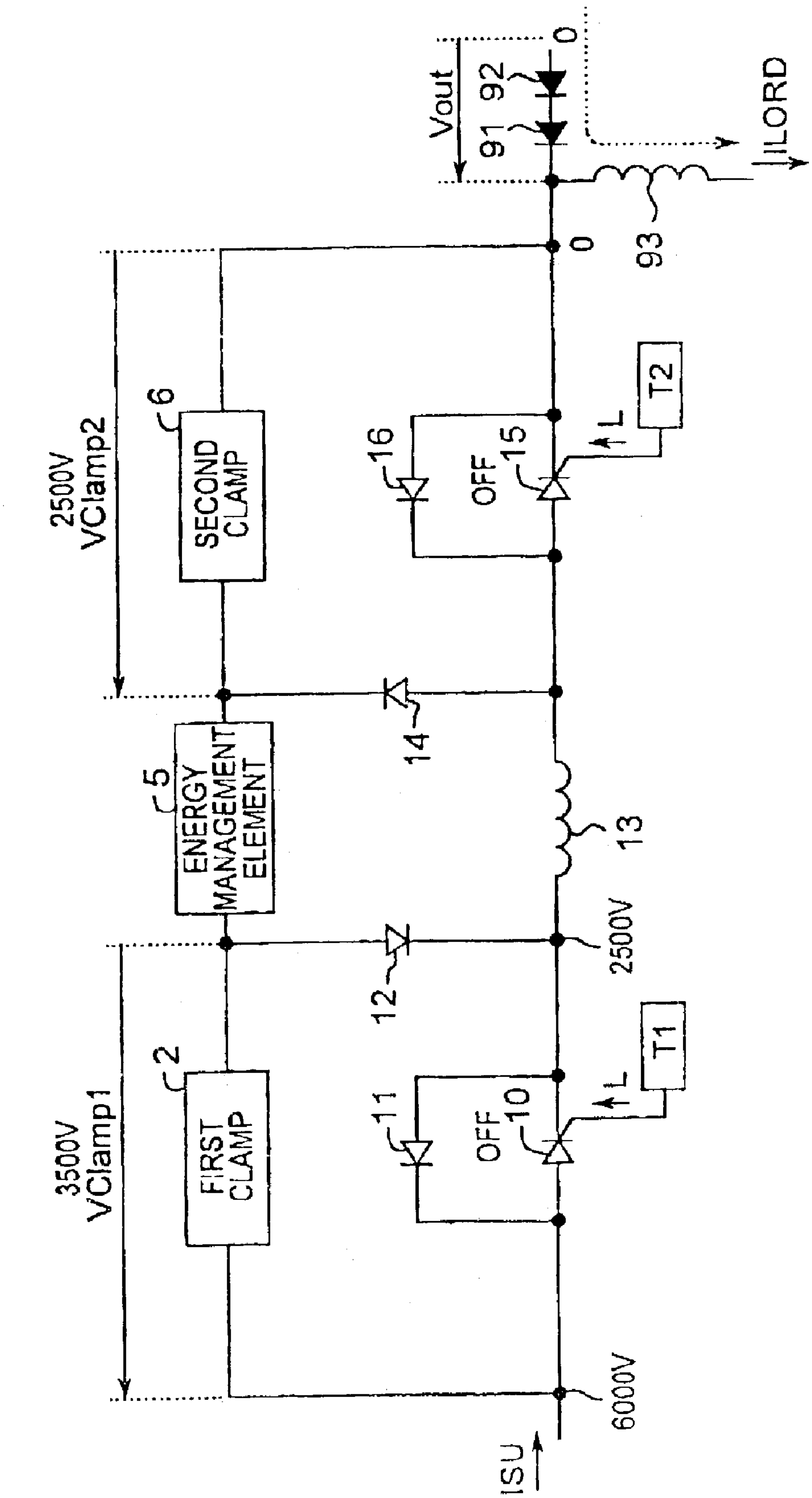
FIG. 6 is similar to FIG. 3, and showing the switch unit in a state that semiconductor switches are turned off.

Next, a detail of the turn on operation of the switching unit SU is described below with reference to FIGS. 6, 7, 8 and 9. In FIG. 9, after t2 and before t3, control circuits T1 and T2 are producing a L. Thus, as shown in FIG. 6, switches 10 and 15 are OFF to prevent any current flowing through switches 10 and 15. Thus, 6000V appears at the end close to the power source, and the first clamp 2 holds 3500V and the second clamp 6 holds 2500V.

Figure 7:
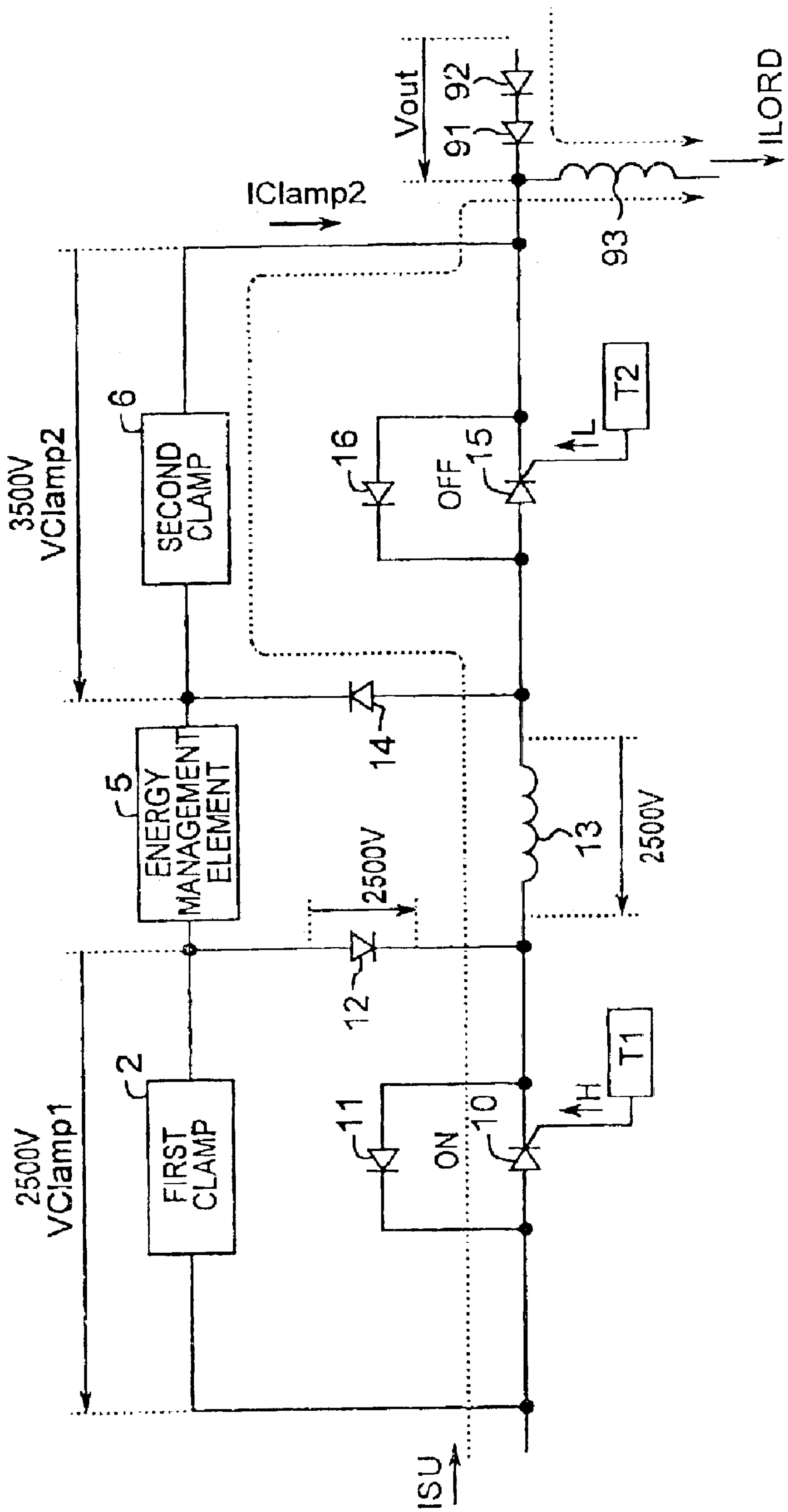
FIG. 7 is similar to FIG. 3, and showing the switch unit, which is being changed to the on state, and particularly showing a state when the first semiconductor switch turns on first.

Then, at time t3, control circuit T1 produces a H. This state is shown in FIG. 7. In response to the H from control circuit T1, switch 10 turns ON to allow current flow through switch 10. At this moment, a voltage 3500V appears across the second clamp 6, and the reactor 13 receives a voltage 2500V (=6000V−3500V), and current ISU will start to increase and run through diode 14 and second clamp 6. A voltage 2500V also appears across diode 12. It is counterbalanced with the voltage 2500V across the first clamp 2. Thus, the voltage across a series connection of first clamp 2 and diode 12 is zero.

Figure 8:
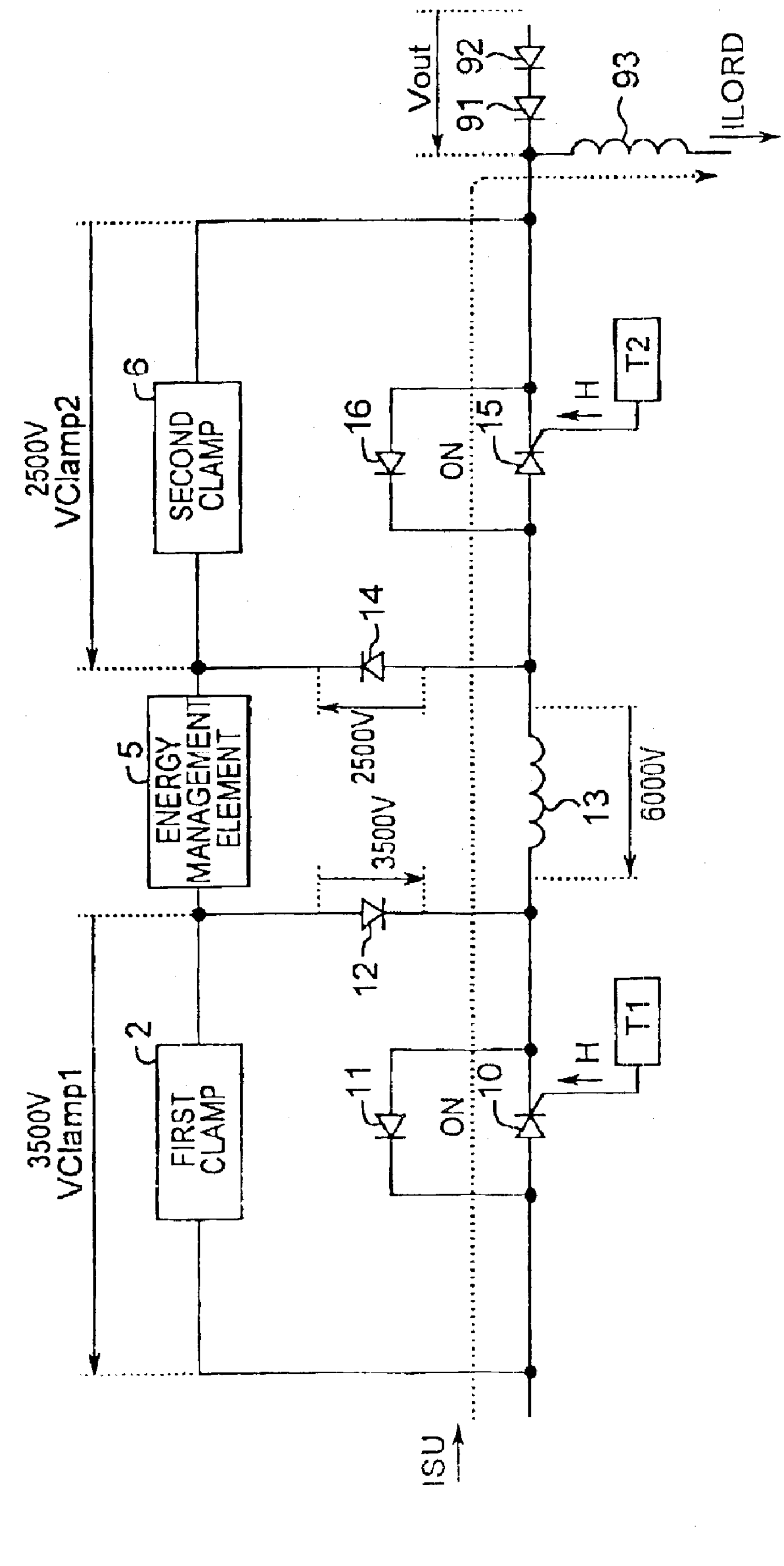
FIG. 8 is similar to FIG. 3, and showing the switch unit, which is being changed to the on state, and particularly showing a state when the second semiconductor switch turns on second.

Then, at time t4, control circuit T2 produces a H. This state is shown in FIG. 8. In response to the H from control circuit T2, switch 15 turns ON. Thus, current flows through switches 10 and 15. At this moment, a voltage 6000V appears across the reactor 13, and current ISU will increase more rapidly. As a consequence, a voltage 3500V appears across diode 12, but is counterbalanced with a voltage 3500V appearing across first clamp 2. Thus, the voltage across a series connection of first clamp 2 and diode 12 is zero. Also, a voltage 2500V (=6000V−3500V) appears across diode 14, but is counterbalanced with a voltage 2500V appearing across the second clamp 6. Thus, the voltage across a series connection of first clamp 6 and diode 14 is zero.

Current ISU is increased, until it reaches ILOAD at t5. Then diodes 91, 92 go to the blocking state, and Vout is 6000V. As a consequence, a voltage 0V appears across reactor 13, and also a voltage 0V across diode 12 and a voltage 0V across diode 14. Then, also a voltage 0V appears across the first clamp 2 and across the second clamp 6. Thus, the switching unit SU according to the present invention can turn on and OFF a high voltage, such as 6000V, without damaging the circuit element.

Figure 33:
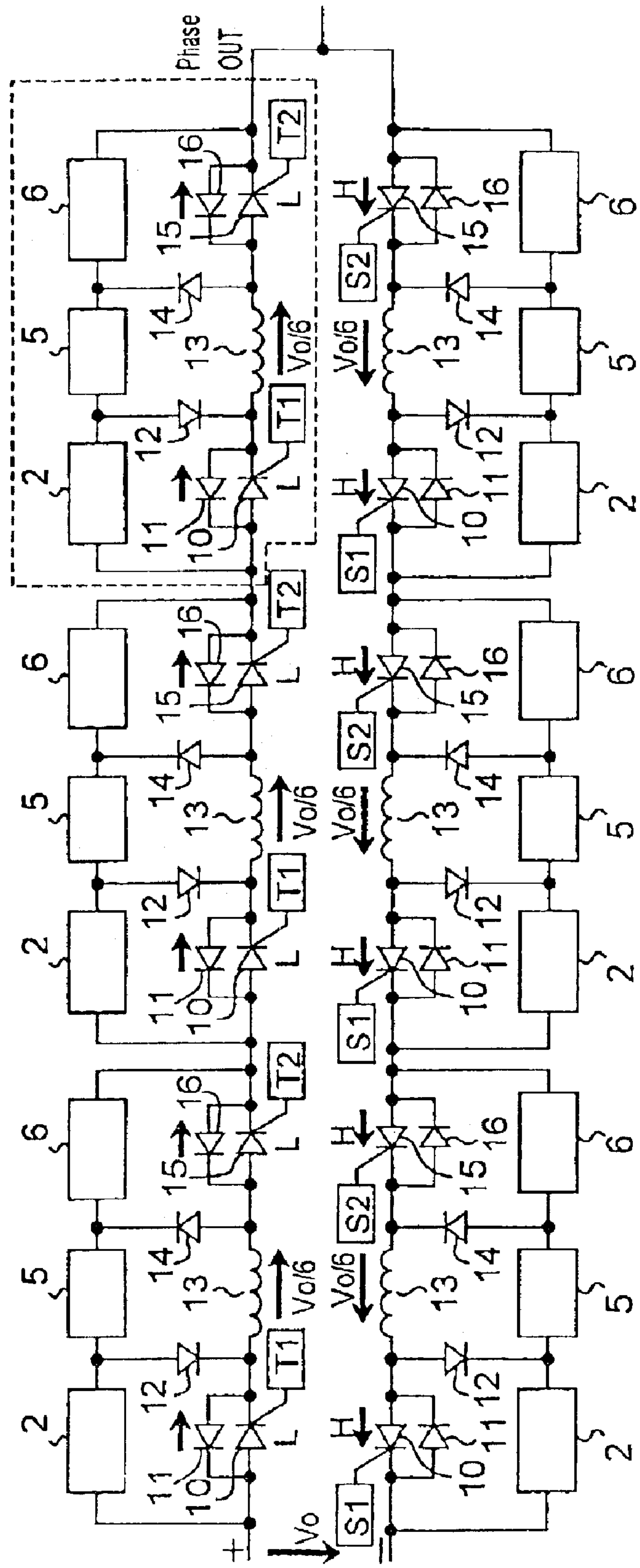
FIG. 33 is a circuit diagram similar to FIG. 1, but showing one operating condition.

FIG. 33 shows typical operating conditions of a phase leg. In the ideal case voltage sharing between reset diodes 12 and 14 is easy and need not to be considered in detail.

Figure 34:
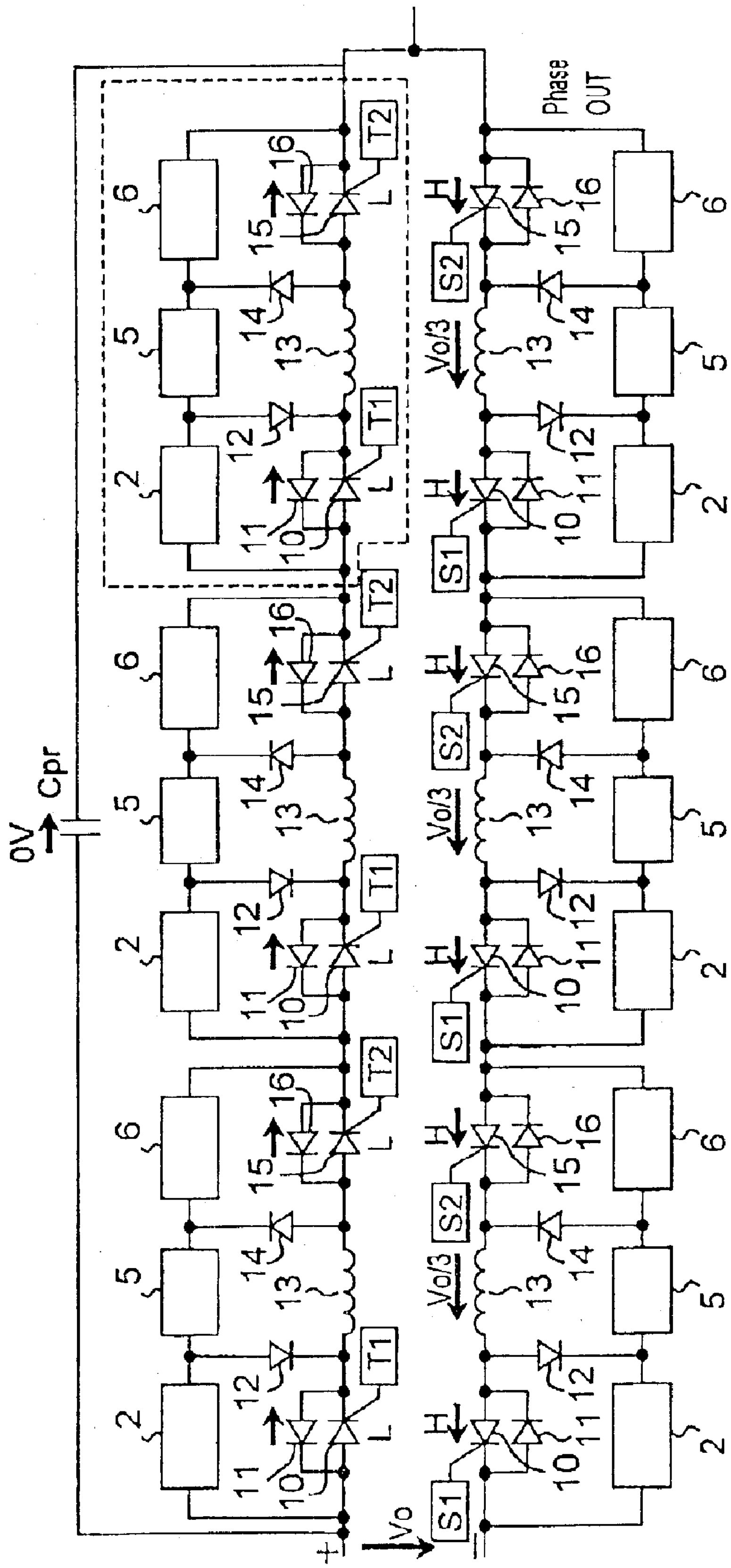
FIG. 34 is a circuit diagram similar to FIG. 1, but showing another operating condition.

In contrast, real applications put strong requirements on reset diode voltage sharing control. For example, as shown in FIG. 34, a parasitic load capacitance Cpr may appear in parallel to the load. After turn on of the semiconductor switches in the negative branch of the phase leg, such capacitance Cpr will keep the voltage at the phase out connection unchanged for a short period of time. As a consequence, the negative branch will receive the full DC link voltage. Then, all reset diodes 12 and 14 in that branch will receive high blocking voltage.

Figure 35:
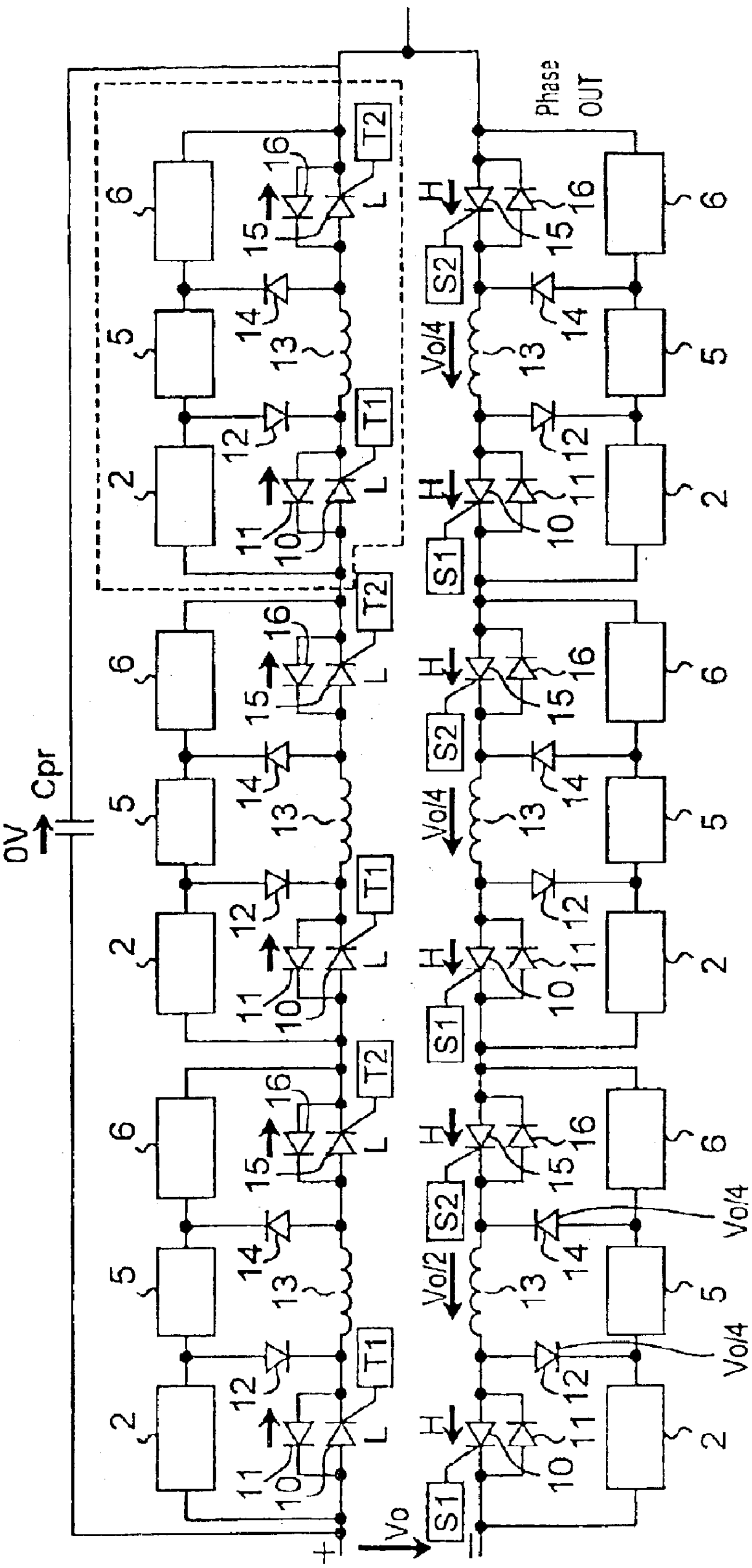
FIG. 35 is a circuit diagram similar to FIG. 1, but showing yet another operating condition.

In FIG. 35 tolerances of diode capacitance are considered for such situation. As a consequence, shown by the example voltage values, reset diodes 12 and 14 with smaller capacitance will receive higher voltage transients. Then, by limiting the diode's voltage the clamps will make sure, that dangerous over-voltage conditions cannot result from such situations.

Figure 10:
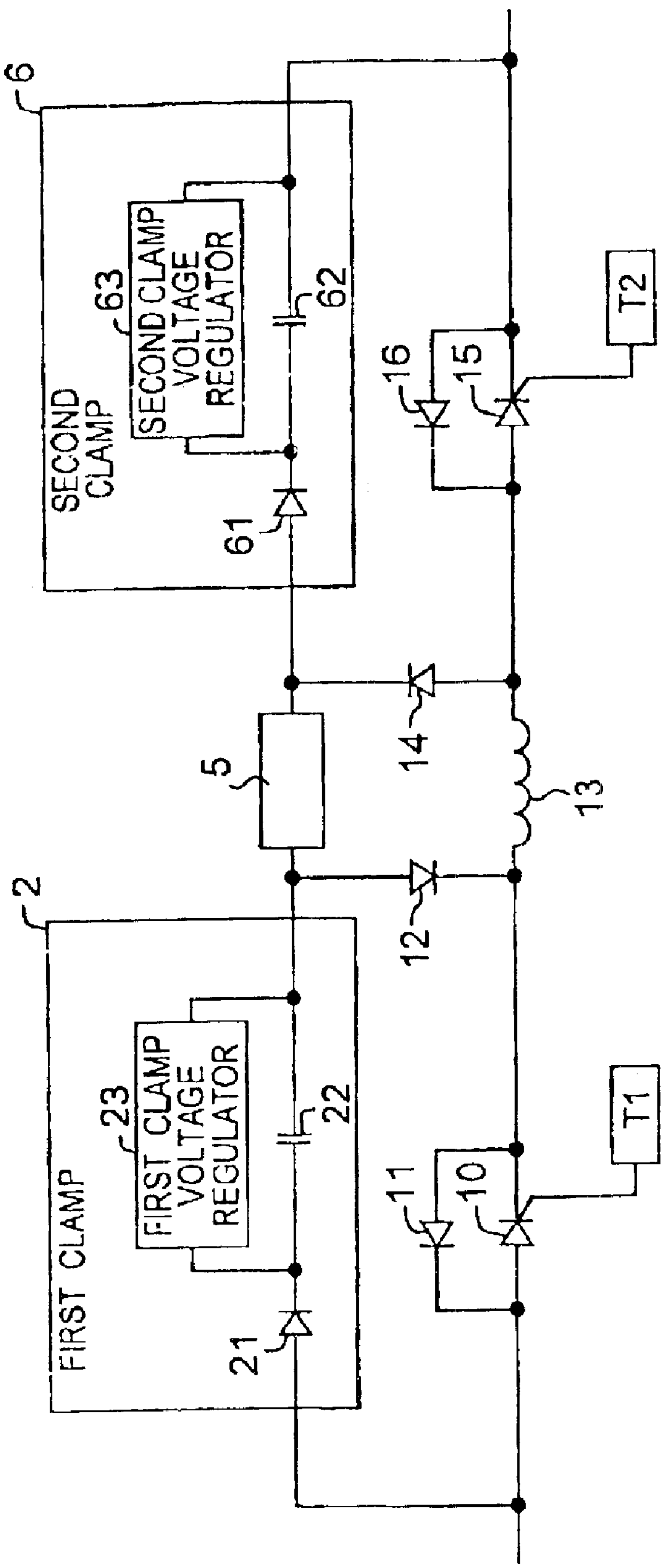
FIG. 10 shows a circuit diagram of the switching unit particularly showing a detail of the clamps.

FIG. 10 shows details of the first and second clamps 2 and 6. The clamp voltage is set by the voltage of a clamp capacitor 22 (or 62) and controlled by a clamp voltage regulator 23 (or 63). A clamp rectifier 21 (or 61) is connected in series with the clamp capacitor 22 (or 62).

The operation of the first clamp 2 is described. When the sum of the voltages on semiconductor switch 10 and reset diode 12 exceed the voltage of the clamp capacitor 22, the clamp rectifier 21, will go into conduction state and transfer excessive charge to the clamp capacitor 22. On the other hand, if the sum of the voltages on semiconductor switch 10 and reset diode 12 is less than the voltage of the clamp capacitor 22, then the clamp diode 21 will go to the blocking state. In this way the clamp capacitor 22 will not be discharged. The above operation also applies to the second clamp 6.

Figure 11:
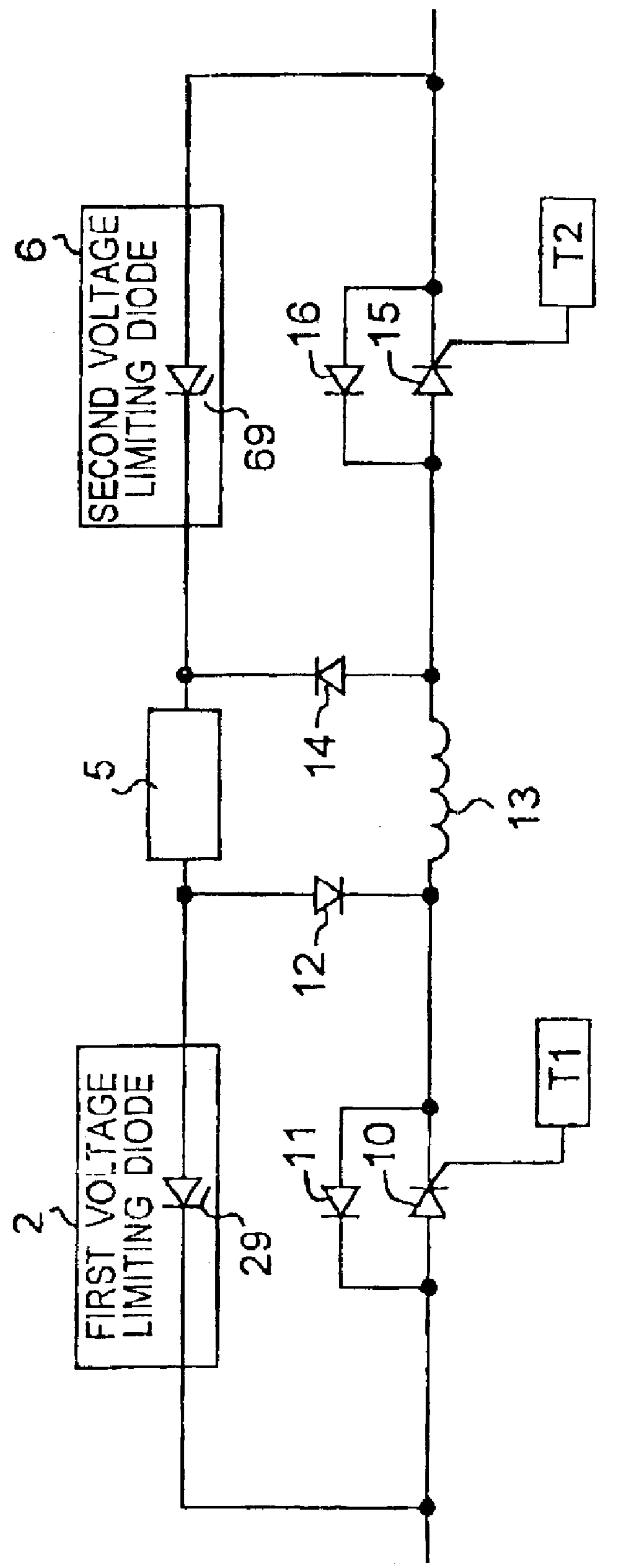
FIG. 11 is similar to FIG. 10, but showing a modification thereof.

FIG. 11 shows a modification of the clamp. Voltage limiting devices 29 and 69 each having zener-characteristic are provided. Voltage limiting devices 29 and 69 are capable of accepting high current high voltage transients. Using such diode 29 and 69, the clamps 2 and 6 will have a very simple structure.

The energy management element 5 may have a various arrangements. For example, a high power low inductance resistor can be applied. Also, a capacitor with a voltage control circuit can be used.

Figure 12:
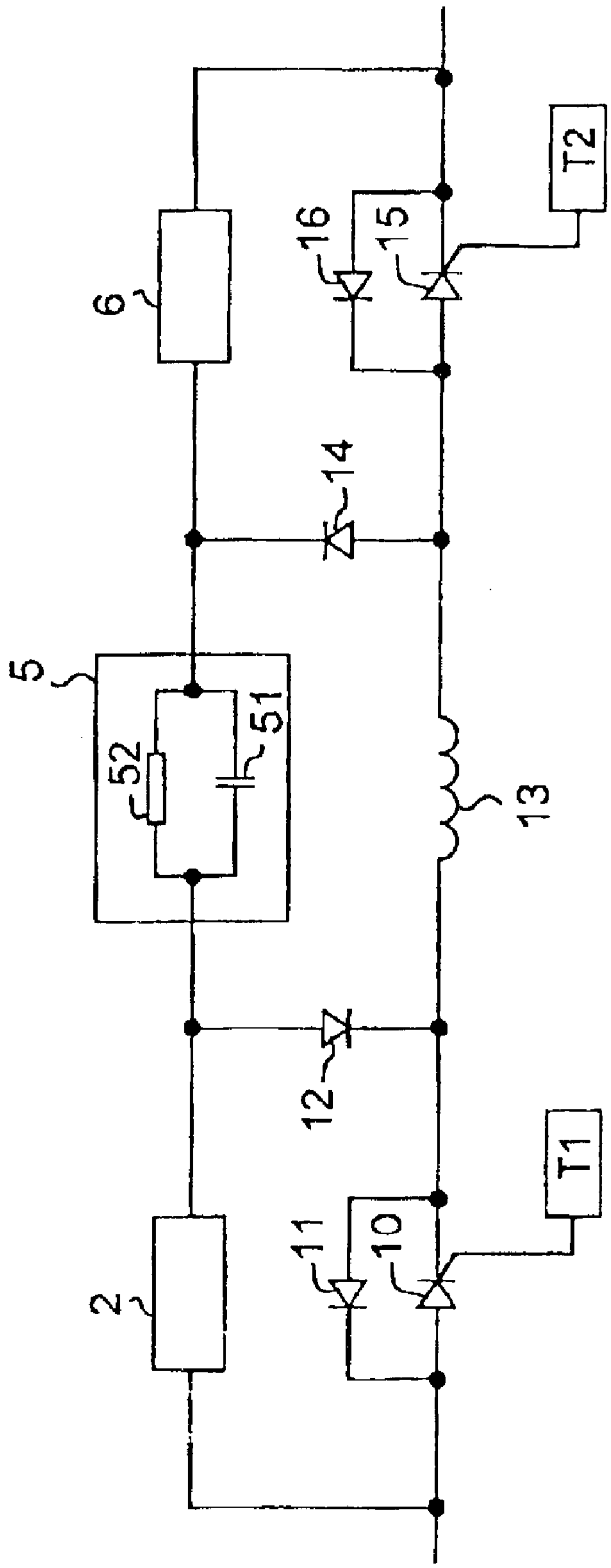
FIG. 12 shows a circuit diagram of the switching unit particularly showing a detail of the energy management element.

As shown in FIG. 12, in a preferred embodiment, energy management element 5 has a capacitor 51, which is connected parallel to a resistor 52. In this way very low parasitic inductance can be realized, resulting in small switching over-voltage transients and, thus, in small load on the clamps 2 and 6. At the same time, circuit simplicity resulting in high reliability also is obtained.

A dangerous situation, which is observed in real applications, occurs when a delay takes place between turn on of semiconductor switches 10 and 15.

Figure 13:
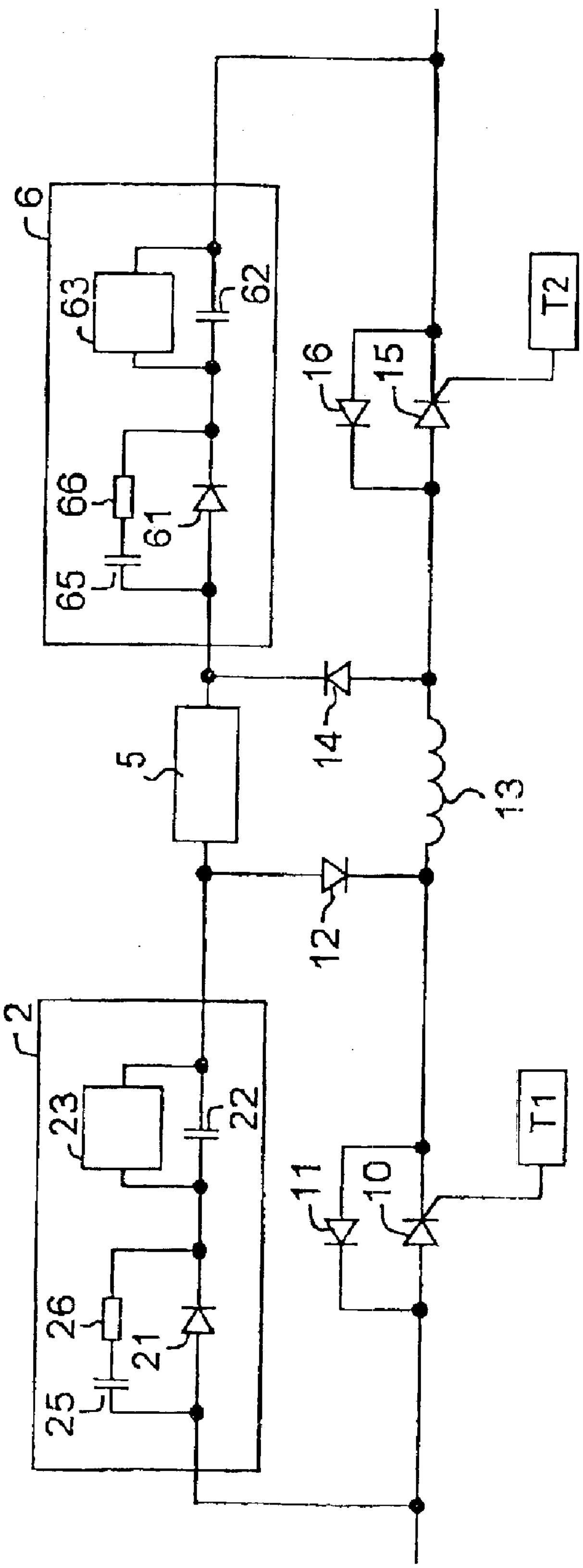
FIG. 13 is similar to FIG. 10, but showing a modification thereof.

In FIG. 13 a preferred embodiment of the clamp 2 and 6 is disclosed. In this embodiment a first RC snubber containing a first snubber capacitor 25 and a first snubber resistor 26 is connected parallel to the first clamp rectifier 21. Similarly, a second RC snubber 65 and 66 is connected parallel to the second clamp rectifier 61.

Figure 14:
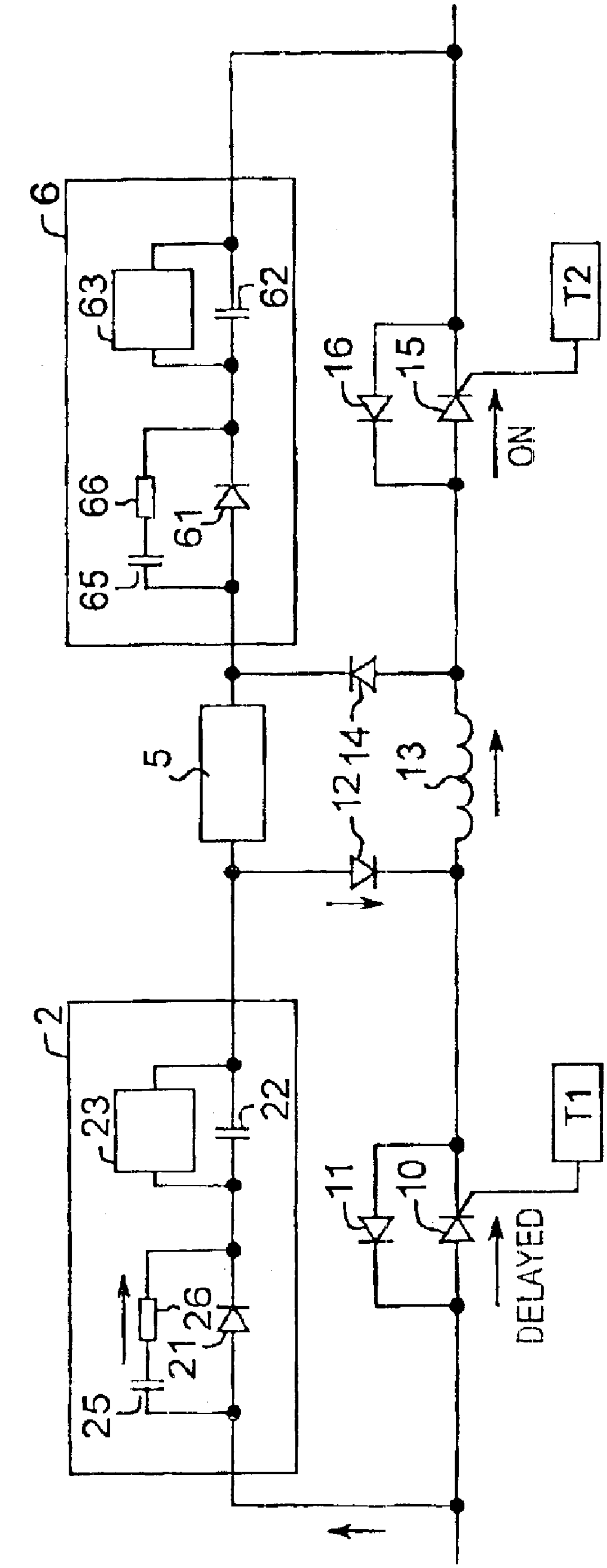
FIG. 14 is similar to FIG. 13, and showing a situation wherein the turn of the first switch 10 is delayed.

Referring to FIG. 14, when the first semiconductor switch 10 delays from the timing of turn on of the second semiconductor switch 15, a current flows through the first clamp 2. The current entering the first clamp will pass through the first RC snubber defined by 25 and 26. In this way the first clamp rectifier 21 will not receive forward current. Thus rectifier 21 stays in off state.

Figure 15:
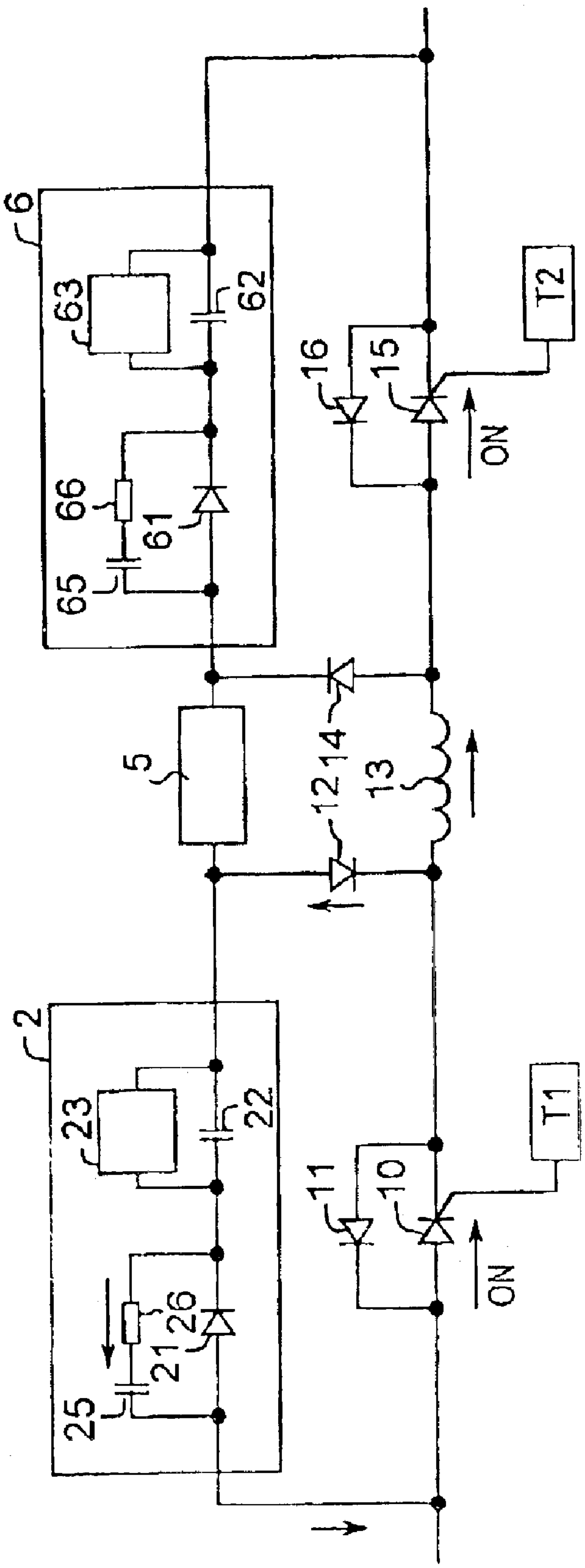
FIG. 15 is similar to FIG. 13, and showing a situation wherein the turn of the first switch 10 is made after the turn on of the second switch.

Referring to FIG. 15, upon delayed turn on of the first semiconductor switch 10, a current will pass in reverse direction through the first RC snubber 25, 26. As a consequence, a voltage across the capacitor 25 of the first RC snubber will be increased. The first clamp rectifier 21 will stay, in off state. It will not show a reverse recovery. Consequently, any danger of damaging the clamp rectifier 21 will be avoided.

Figure 16:
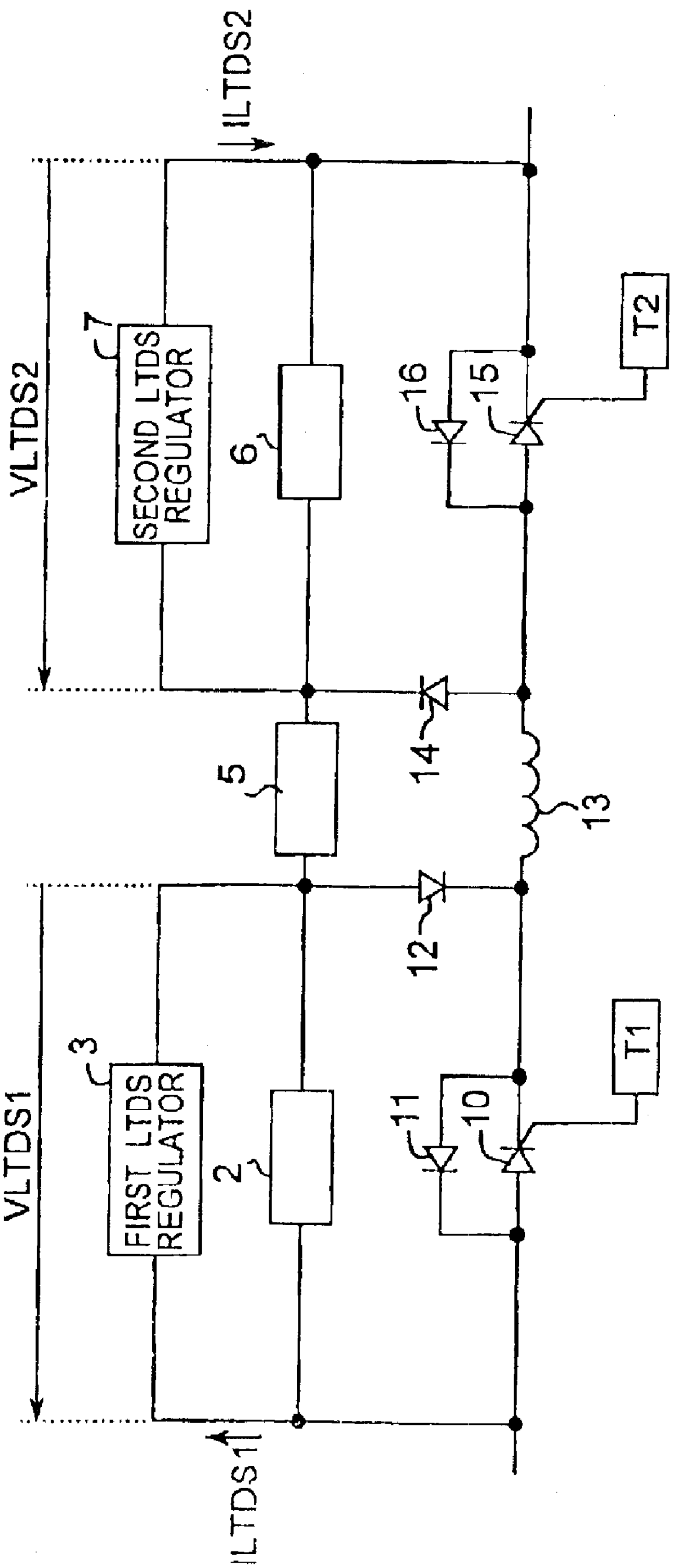
FIG. 16 shows a circuit similar to FIG. 3, but further provided with LTDS regulators.

FIG. 16 shows an additional circuit to satisfy a long term DC stability requirements of silicon high power semiconductors (10, 11, 15, 16). A first LTDS (long term D.C. stability) regulator 3 is connected parallel to the first clamp 2, and a second LTDS regulator 7 is connected parallel to the second clamp 6.

Figure 17A:
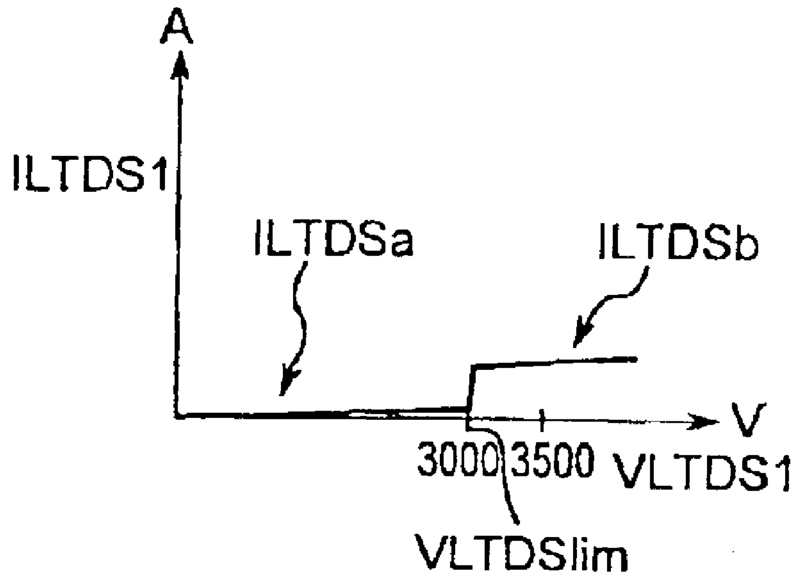
FIGS. 17*a* and 17*b* show, respectively, the characteristics of the first and second LTDS regulators shown in FIG. 16.
Figure 17B:
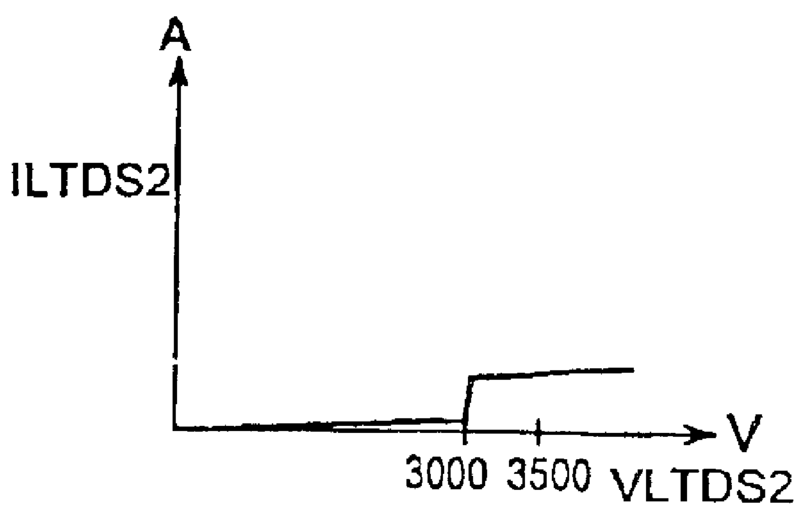

Preferred characteristics of the first and second LTDS regulators 3 and 7, respectively, are shown in FIGS. 17*a* and 17*b*. The LTDS regulator 3 will draw a small current ILTDSa, if the applied voltage is smaller than a limit voltage VLTDSlim, and a higher current ILTDSb is drawn at voltage higher than the limit voltage VLTDSlim.

The limit voltage VLTDSlim is set equal to or smaller than the LTDS specification value of the semiconductor switch, the current ILTDSa is set considerably smaller than the leakage current of the semiconductor switch 10 and diode 11. The current ILTDSb is set considerably higher than the leakage current of the semiconductor switch 10 and diode 11. For example, limit voltage VLTDSlim is set to 3000V. In this way the LTDS regulator 3 will be able to cope with switching transients as high as the clamp voltage without excessive power dissipation. After the transient, however, it will work against the leakage current of the semiconductor switches in a series connection to make sure that the voltage of its respective semiconductor switch will be reduced towards the value VLTDSlim. The same applies to the LTDS regulator 7.

If only one diode 21 or 61 is used for the clamp rectifier, as shown in FIG. 10, then full voltage across the clamp capacitor 22 or 62 is applied to that diode 21 or 61 during on state of the respective semiconductor switch 10 or 15. As a consequence, the diode 21 or 61 must be designed to withstand such LTDS value. But a diode with high LTDS value shows high forward recovery, degrading the desired activity of the clamp.

Figure 18:
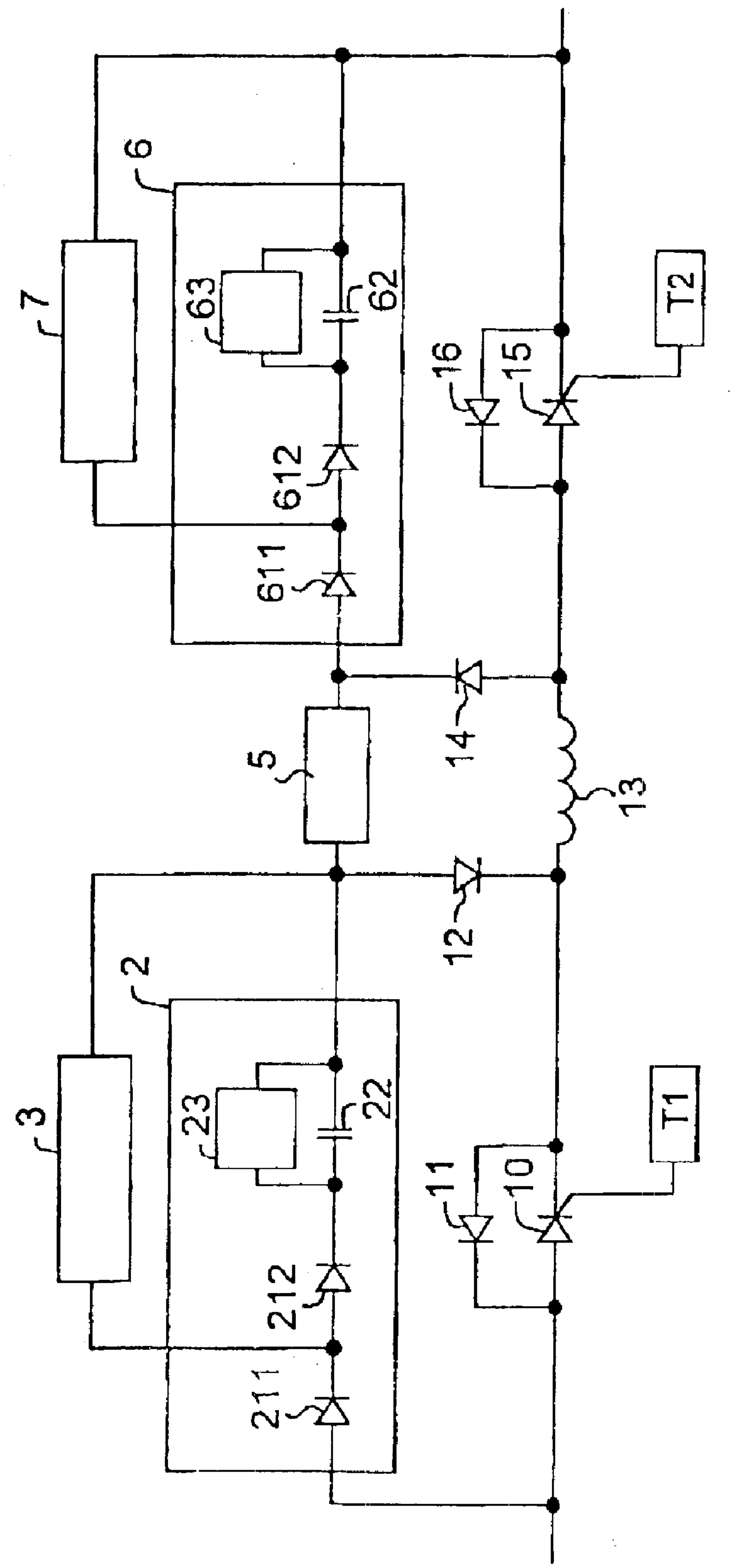
FIG. 18 is similar to FIG. 17, but showing a detail of the first and second clamps.

FIG. 18 shows a preferred solution. The first clamp 2 contains a clamp rectifier 21 having a rectifier diode 211 and a rectifier diode 212 in a series connection. Similarly, the second clamp 6 contains a clamp rectifier 61 having a rectifier diode 611 and a rectifier diode 612 in a series connection. Then, smaller blocking voltage can be chosen for the rectifier diodes. Additionally, the LTDS regulator 3 has its one end connected to a junction between rectifier diode 211 and rectifier diode 212. Similarly, a LTDS regulator 7 has its one end connected to a junction between rectifier diode 611 and rectifier diode 612. In this way each of the LTDS regulators 3 and 7 will influence the rectifier diode 211 or 611, when the semiconductor switch is in on state, and reduce its steady state blocking voltage to VLTDSlim, and rectifier diode 212 or 612 will receive even smaller voltage.

Figure 19:
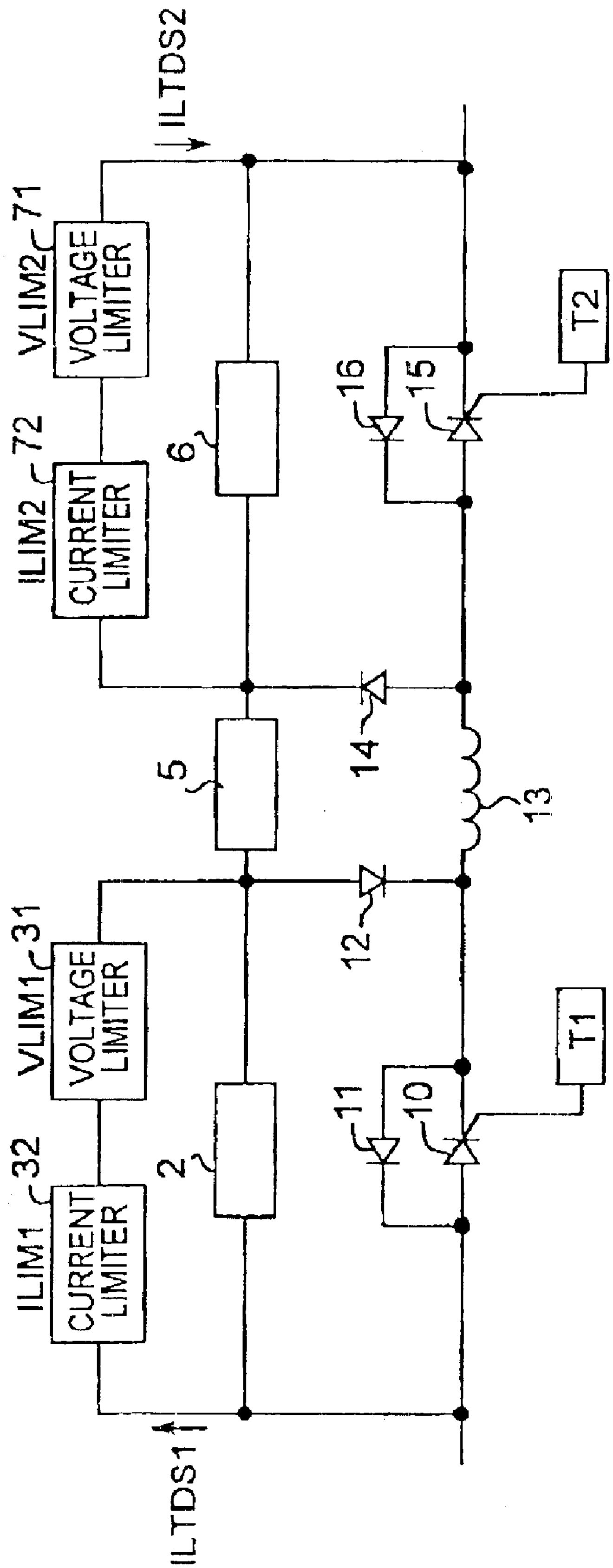
FIG. 19 shows a circuit diagram similar to FIG. 3, but showing an example of the LTDS regulators.
Figure 20A:
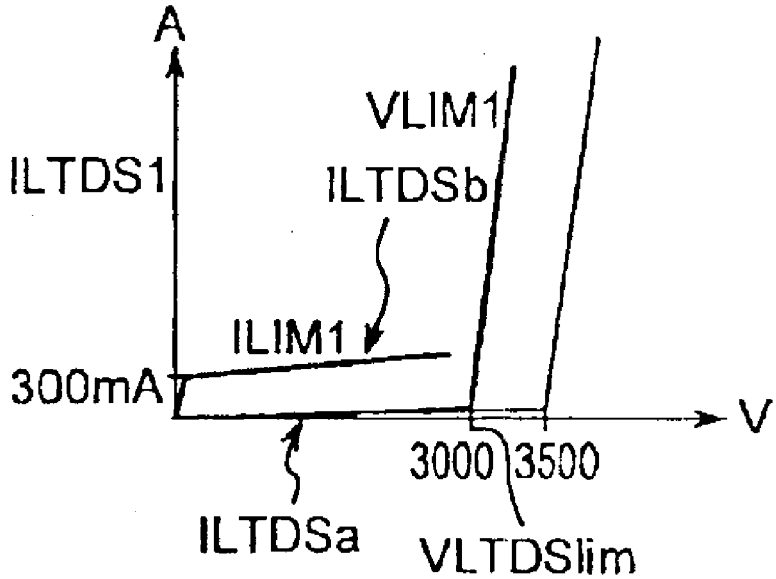
FIGS. 20*a* and 20*b* show, respectively, the characteristics of the first and second voltage limiting regulators.
Figure 20B:
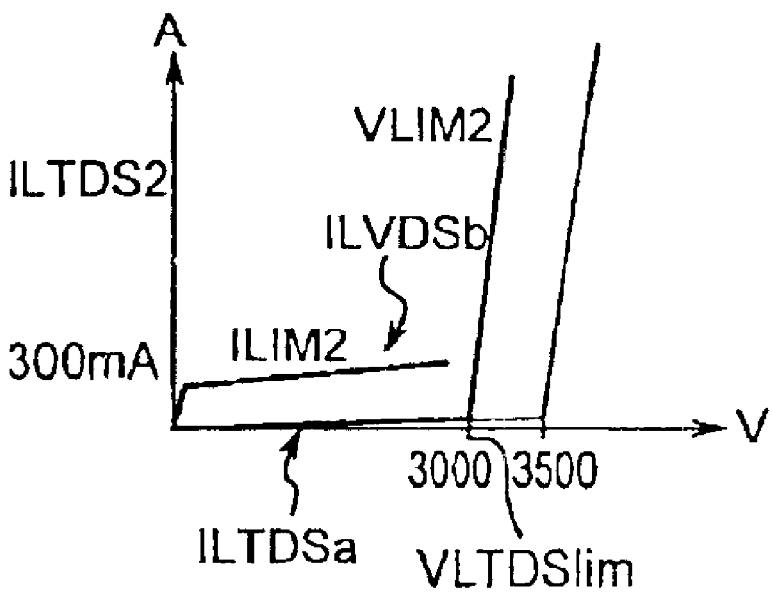

FIG. 19 shows a further embodiment of the first and second LTDS regulators 3 and 7. LTDS regulator 3 contains a voltage limiting regulator 31 and a current limiting regulator 32. Similarly, LTDS regulator 7 contains a voltage limiting regulator 71 and a current limiting regulator 72. The two regulators are connected in series. The first voltage limiting regulator 31 has a voltage-limiting characteristic VLIM1 as shown in FIG. 20*a*, with a limiting voltage VLTDSlim. The second voltage limiting regulator 71 has a voltage-limiting characteristic VLIM1 as shown in FIG. 20*b*, with a limiting voltage VLTDSlim. Current limiting regulator 32 shows current limiting characteristics with a value ILTDSb, as shown in FIG. 20*a*. The same applies to the current limiting regulator 72. In such way zener diodes may be used in first voltage limiting regulator 31 or in the second voltage limiting regulator 71. The voltage range of the current limiting regulators 32 and 72 is significantly reduced with respect to the rating of the LTDS regulator.

Figure 21:
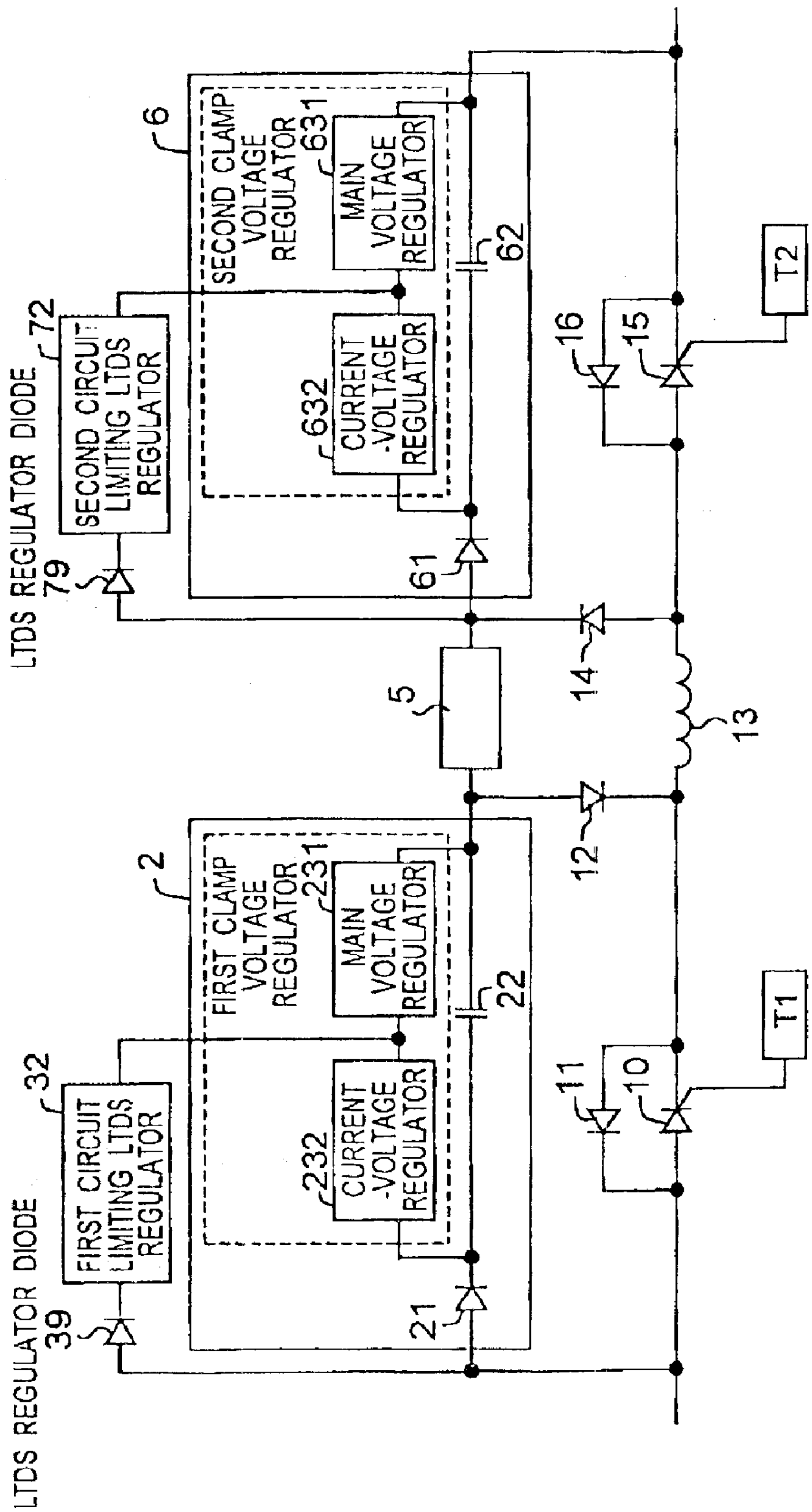
FIG. 21 is a circuit diagram of the switching unit showing a detail of the first and second clamps.
Figure 22:
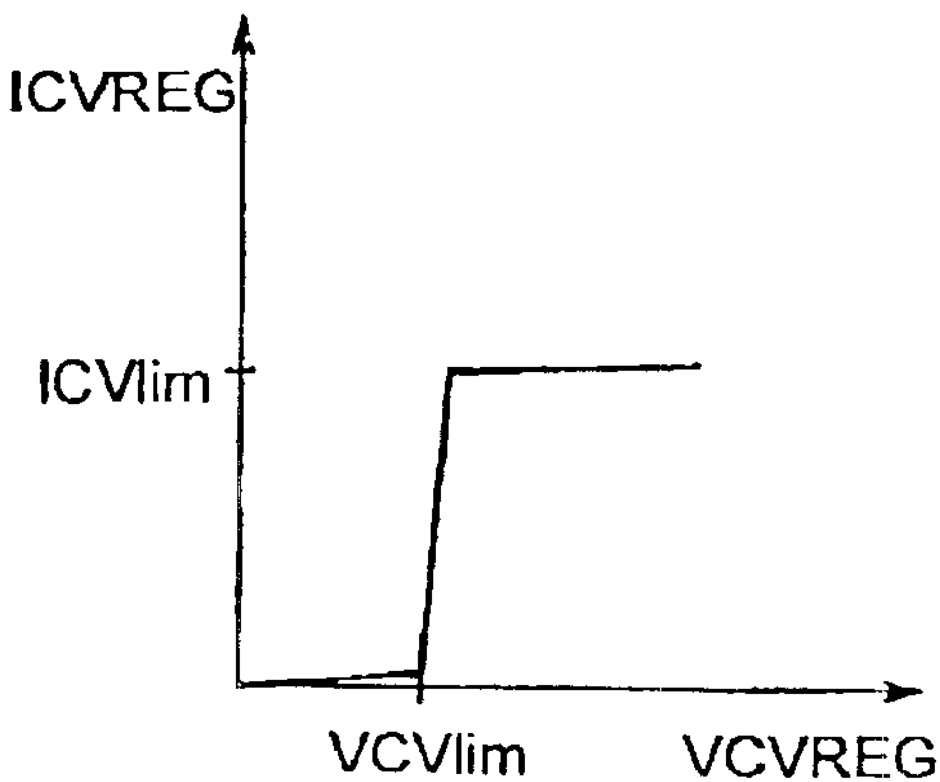
FIG. 22 is a graph showing characteristics of a current-voltage regulator shown in FIG. 21.

FIG. 21 shows a modification of the clamp and LTDS circuits. The first clamp regulator is formed by a series connection of a main voltage regulator 231 and a current-voltage regulator 232. The second clamp regulator is formed by a series connection of a main voltage regulator 631 and a current-voltage regulator 632. The limit value of the main voltage regulator 231 or 631 is set to VLTDSlim. The current-voltage regulator 232 or 632 has characteristics as shown in FIG. 22 with VCVlim=VCL−VLTDSlim. The current ICVlim is defined in such a way, that the reset time of the clamp capacitor 22 or 62 is short enough to satisfy worst case switching conditions of the semiconductor switch 10 or 15. In such way only the current limiting LTDS regulators 32 or 72 are required to satisfy the additional LTDS requirements of the first and second semiconductor switches 10 or 15, and diodes 11 or 16.

Figure 23:
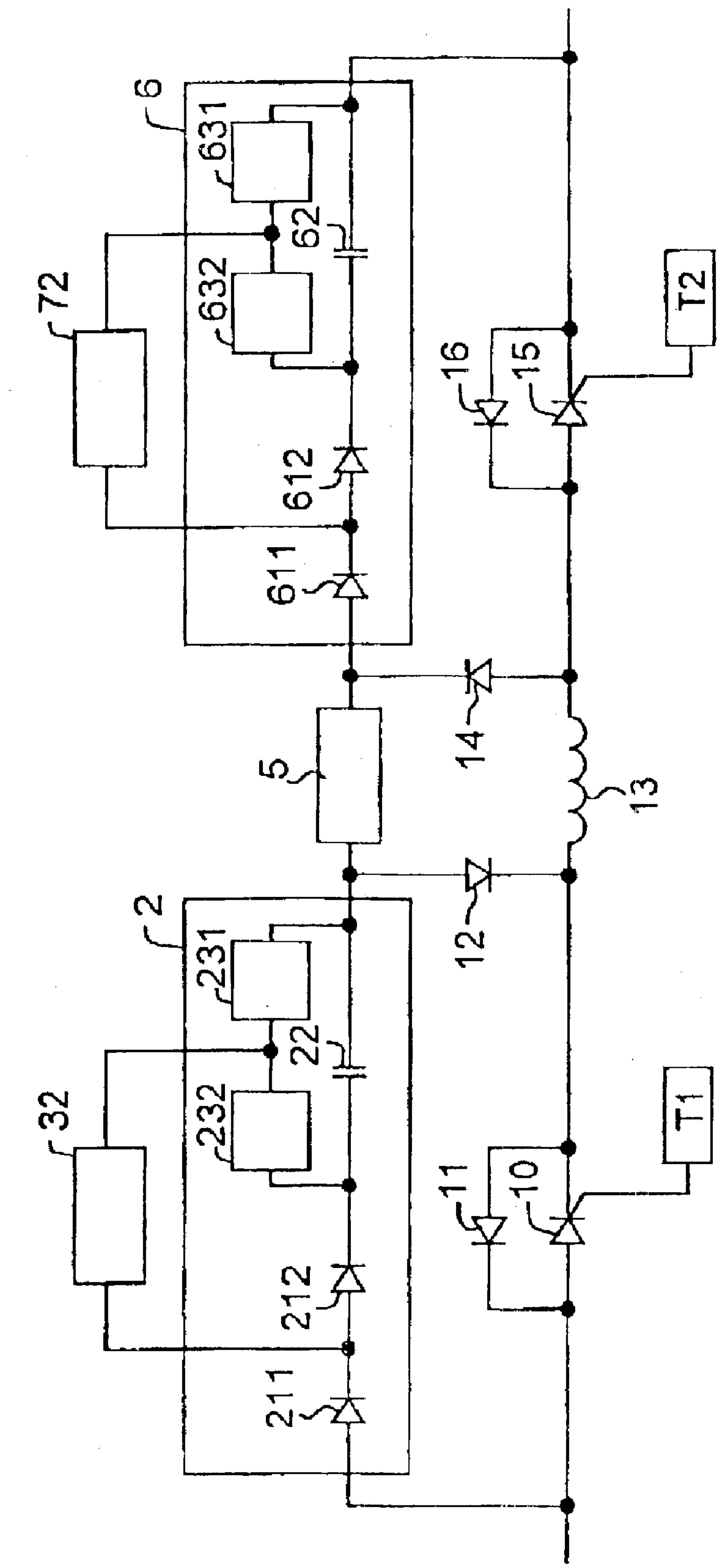
FIG. 23 is a circuit diagram similar to FIG. 21, but showing the diodes at different locations.

FIG. 23 shows a modification of the circuit of FIG. 21, wherein the current limiting LTDS regulators 32 and 72 are connected in series with diodes 39 and 79, respectively.

Figure 24:
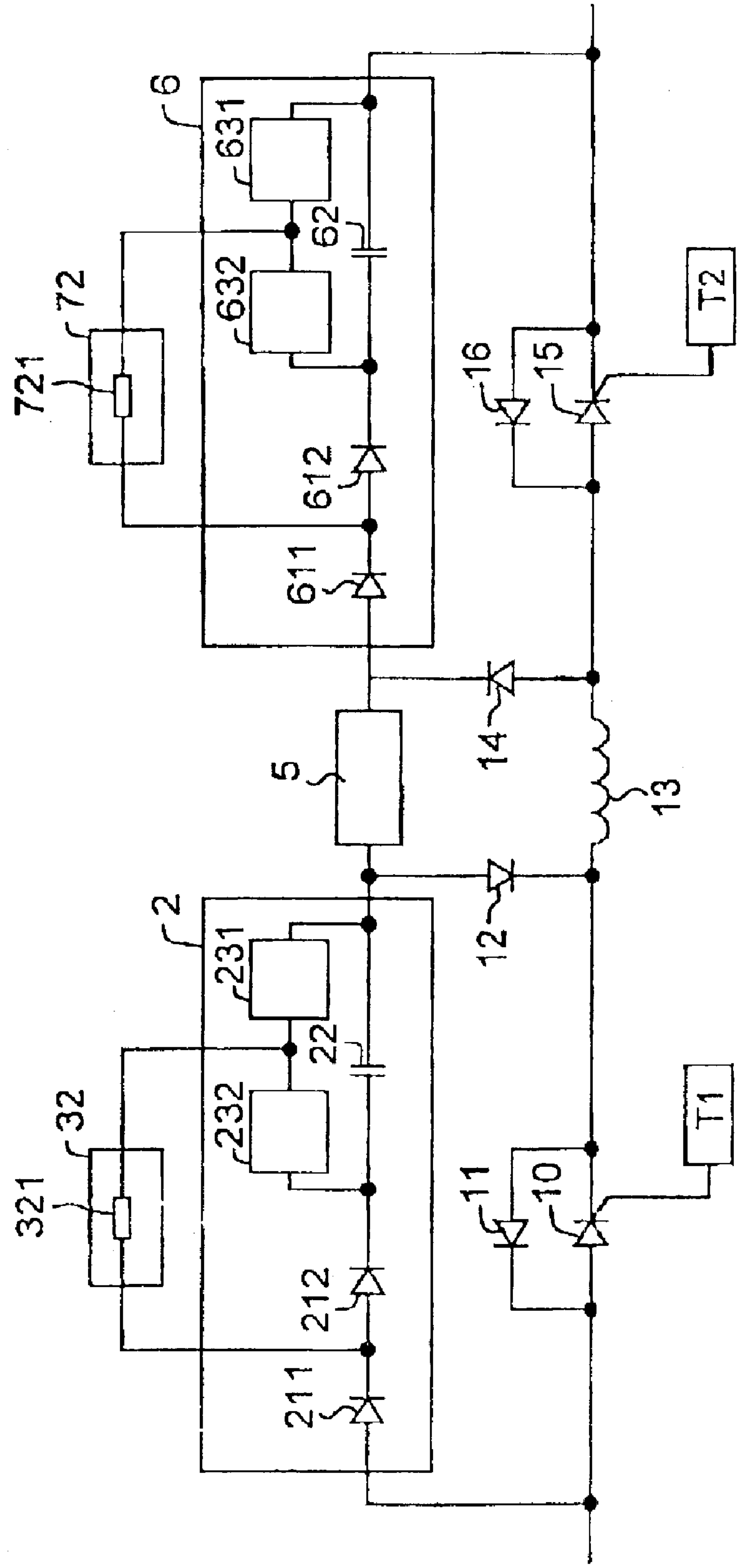
FIG. 24 is a circuit diagram similar to FIG. 21, but showing an example of current limiter.

FIG. 24 shows a detail of the current limiting LTDS regulators 32 and 72, which are formed by containing resistors 321 and 721, respectively. This arrangement is preferable especially in the case where small leakage current through the semiconductor switches 10 and 15 and the diodes 11 and 16 are observed. By the resistor 321 and 721, linear current-voltage characteristics can be obtained.

Figure 25:
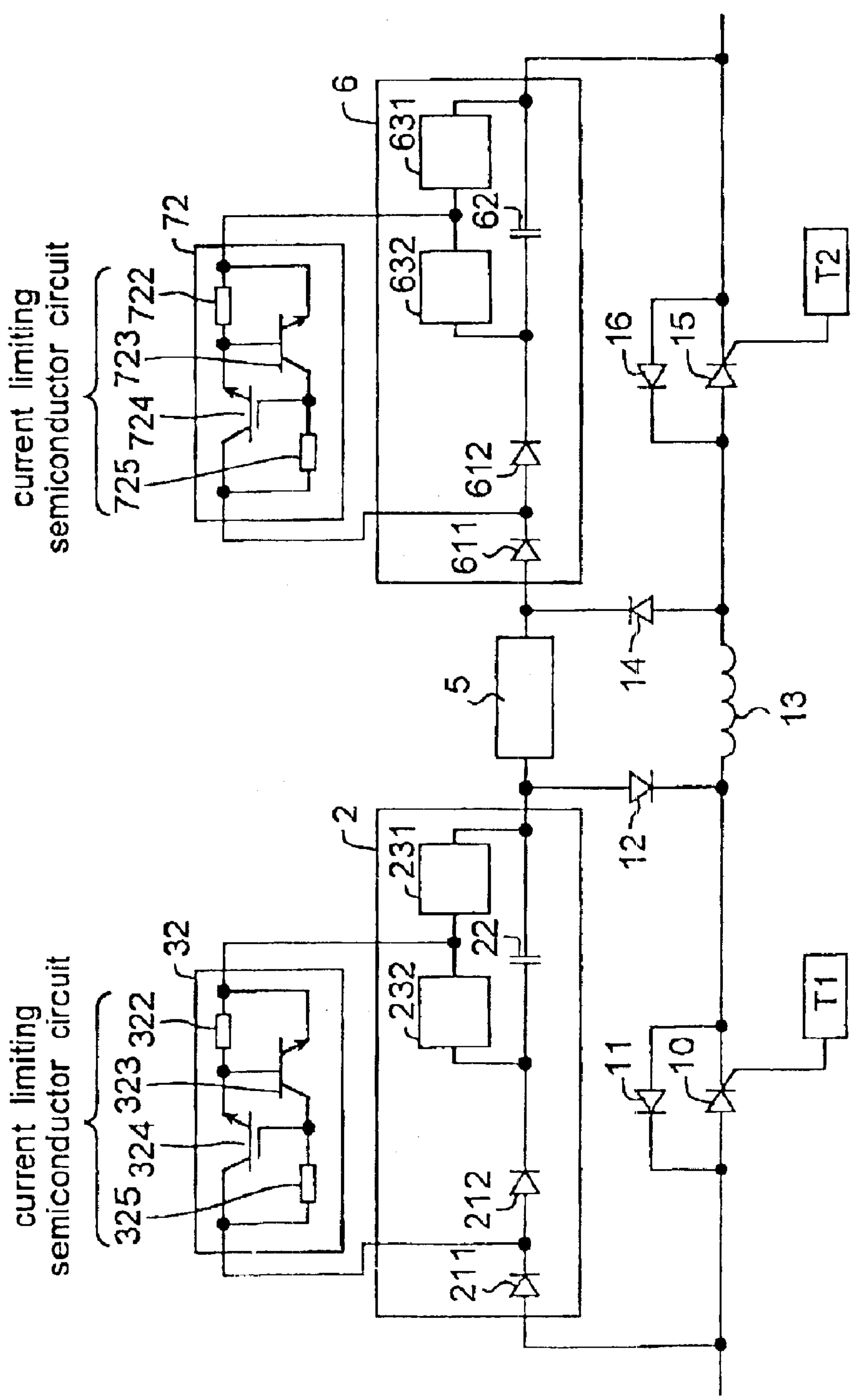
FIG. 25 is a circuit diagram similar to FIG. 22, but showing a detail of the current limiting LTDS regulator.

FIG. 25 shows a modification of the current limiting LTDS regulators 32 and 72. The current limiting LTDS regulator 32 includes an IGBT 324 or a series connection of IGBTs, and a current sensing bipolar transistor 323 for controlling the IGBT 324. Resistors 325 and 322 are provided to their gate and base. Similarly, the current limiting LTDS regulator 72 includes an IGBT. 724 or a series connection of IGBTs, a current sensing bipolar transistor 723, and resistors 725 and 722. The circuit of FIG. 25 is suitable for a case wherein more elevated leakage current flows through the semiconductor switches 10 and 15 and the diodes 11 and 16.

Figure 26:
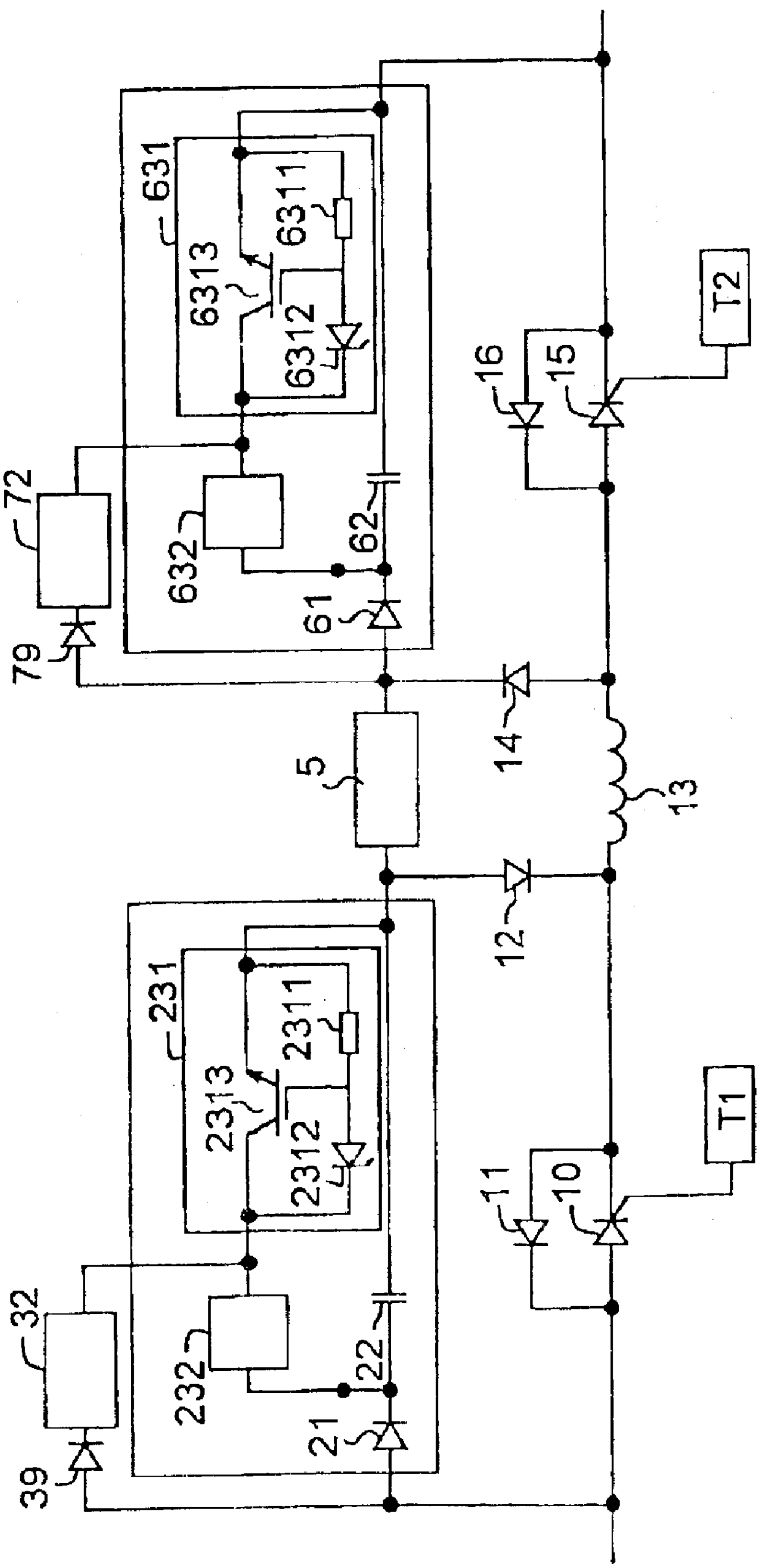
FIG. 26 is a circuit diagram similar to FIG. 21, but showing a detail of the main voltage regulator.

FIG. 26 shows an arrangement of the main voltage regulators 231 and 631. The main voltage regulator 231 contains at least an IGBT 2313 or a series connection of IGBTs. The gate is controlled by a resistor 2311 and a zener diode 2312 or a series connection of zener diodes, or a circuits representing an equivalent characteristic, e.g. an operational amplifier, which compares the voltage across the main voltage regulator with a predetermined voltage. Similarly, the main voltage regulator 631 also contains at least an IGBT 6313 or a series connection of IGBTs, a zener diode 6312 and a resistor 6311.

Figure 27:
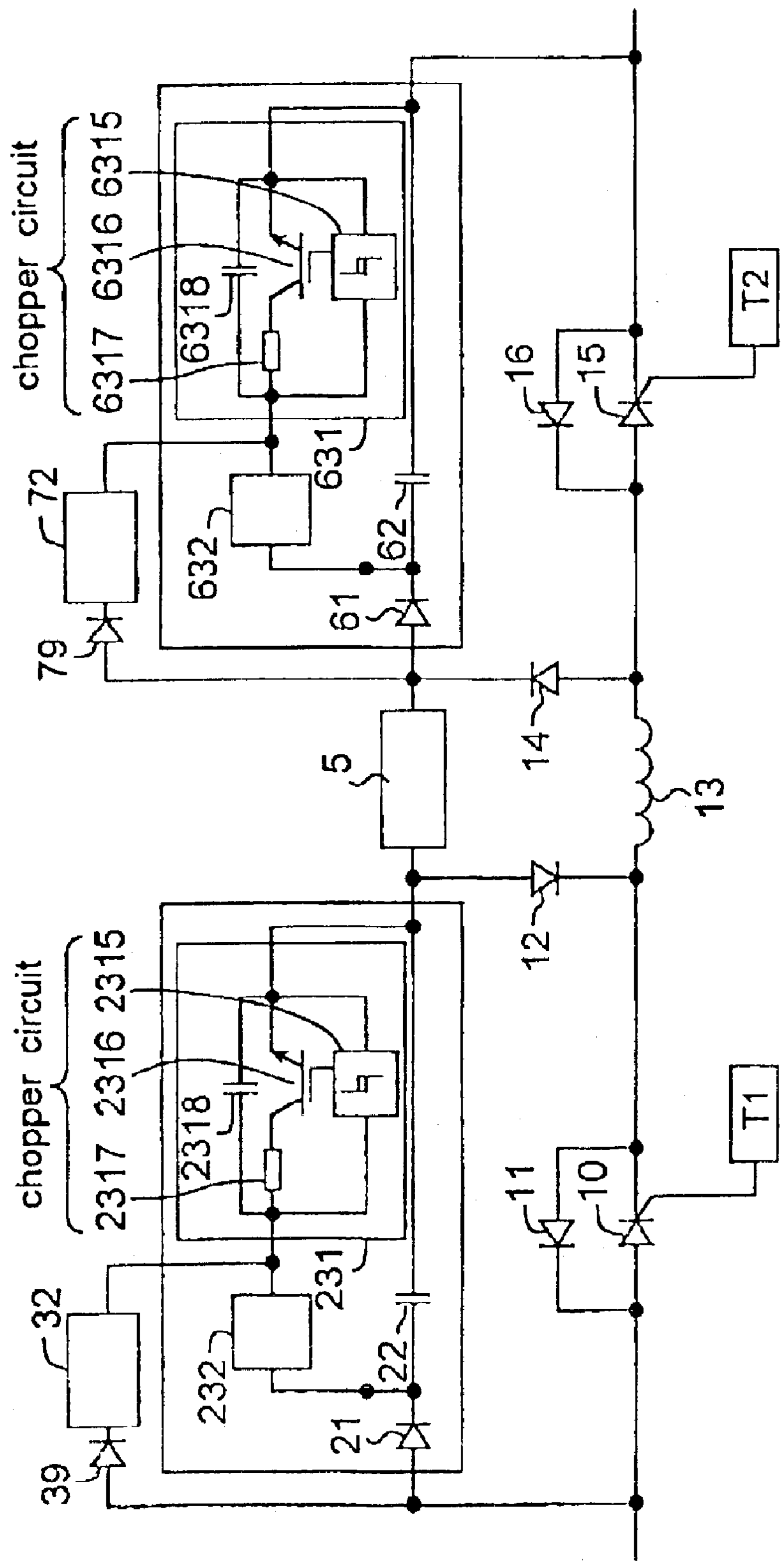
FIG. 27 is a circuit diagram similar to FIG. 26, but showing a modification thereof.

FIG. 27 shows a modification of the main voltage regulators 231 and 631. The main voltage regulator 231 contains a chopper circuit defined by a hysteresis circuit 2315, IGBT 2316 and resistor 2317, and a smoothing capacitor 2318. Similarly, the main voltage regulator 631 contains a chopper circuit defined by a hysteresis circuit 6315, IGBT 6316 and resistor 6317, and a smoothing capacitor 6318. In this way, a low loss high voltage semiconductor 2316 and 6316, such as IGBTs or GCTs is used, and power is dissipated in a reliable, low cost high power resistors 2317 and 6317.

Figure 28:
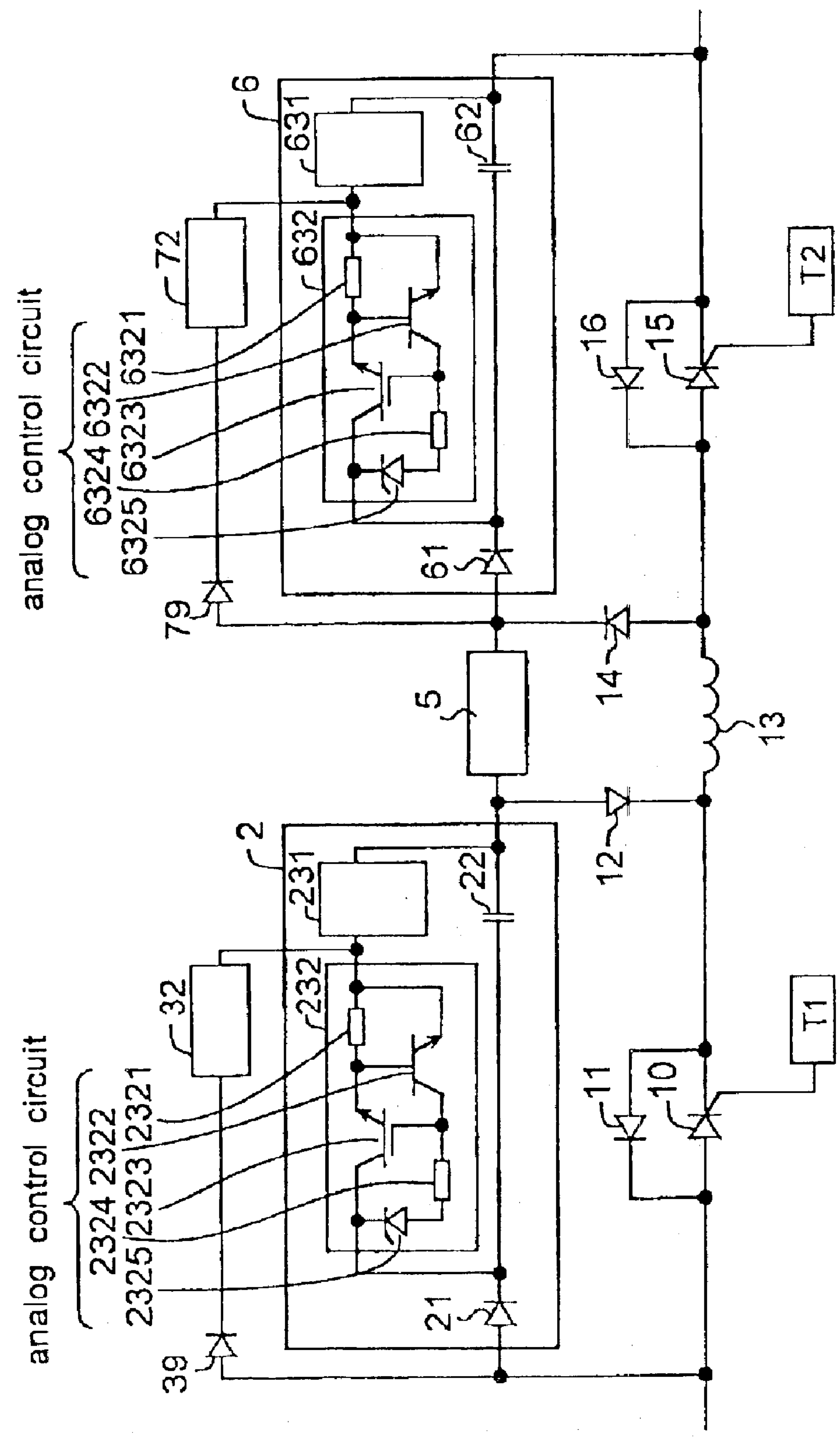
FIG. 28 is a circuit diagram similar to FIG. 21, but showing a detail of the current-voltage regulator.

In FIG. 28 a preferred embodiment of the current-voltage regulators 232 and 632 is shown. In this embodiment the current-voltage regulator 232 includes an IGBT 2323, which is gate controlled, in an analog mode for maximum voltage, by a zener circuit. The zener circuit includes a zener, diode 2324 and a resistor 2325 or an equivalent circuit. A current is limited by a current sensing bipolar transistor 2322 and a resistor 2321 or an equivalent circuit. Similarly, the current-voltage regulator 632 includes an IGBT 6323, which is gate controlled, in an analog mode for maximum voltage, by a zener circuit. The zener circuit includes a zener diode 6324 and a resistor 6325 or an equivalent circuit. A current is limited by a current sensing bipolar transistor 6322 and a resistor 6321 or an equivalent circuit.

Figure 29:
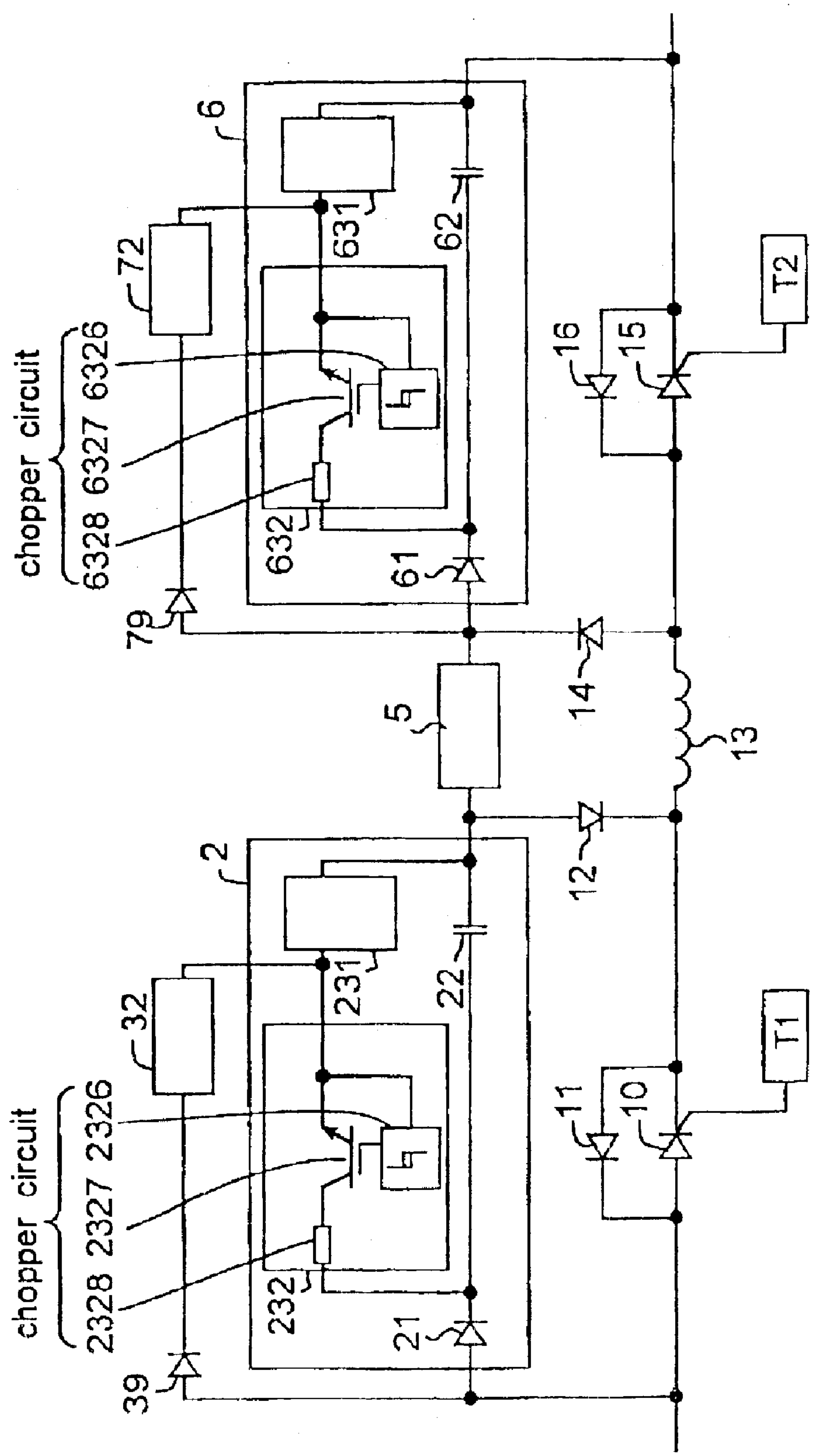
FIG. 29 is a circuit diagram similar to FIG. 28, but showing a modification thereof.

FIG. 29 shows a modification of FIG. 28. In the circuit FIG. 29, the current-voltage regulators 232 includes chopper circuit having a hysteresis controller 2326, a resistor 2328 and a fast switching element 2327 such as IGBT or GCT. Similarly, the current-voltage regulator 632 includes chopper circuit having a hysteresis controller 6326, a resistor 6328 and a fast switching element 6327 such as IGBT or GCT.

Figure 30:
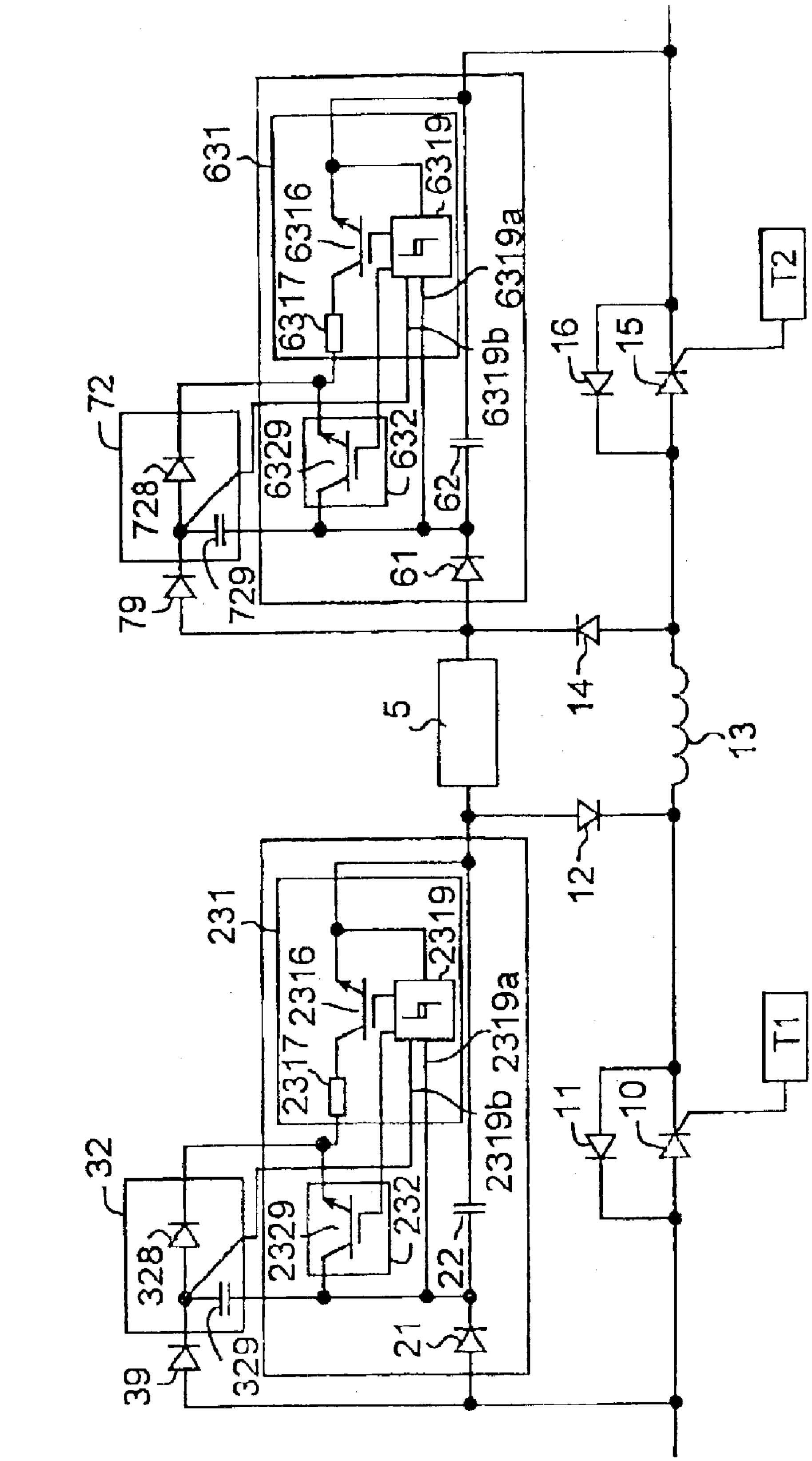
FIG. 30 is a circuit diagram similar to FIG. 30, but showing a detail of the first and second clamps.

FIG. 30 shows a preferred embodiment of clamp 2 and LTDS regulators 3 and 7. In the clamp voltage regulator, the main voltage regulator has a chopper circuit defined by transistor 2316 and resistor 2317, and a hysteresis circuit 2319. The hysteresis circuit 2319 has two inputs 2319*a* and 2319*b*. The current voltage regulator 232 has a switching transistor 2329. The current limiting LTDS regulator 32 includes a capacitor 329 and a diode 328. Capacitor 329 has a considerably small capacitance (such as 0.2 $\mu$F) than the capacitance (such as 4 $\mu$F) of the clam capacitor 22. The other clamp voltage regulator is arranged in the same manner.

Operation of turn off in the first clamp is as follows.

When the anode-cathode voltage of the semiconductor switch 10 reaches the voltage of the clamp capacitor 22, then current flows through clamp rectifier 21 and charge clamp capacitor 22 to a higher voltage. It is noted that such new level is higher than the upper level defined for clamp input 2319*a* of the two-input hysteresis circuit 2319. Then the two-input hysteresis circuit 2319 first turns on switching transistor 2329, and thereafter operates the chopper circuit (transistor 2316 and resistor 2317). In this way, clamp capacitor 22 is reset to the lower hysteresis level defined for the clamp input 2319*a* of the two-input hysteresis circuit 2319, and transistor 2316 is turned off. Thereafter, also switching transistor 2329 is turned off.

During the initial current flow through clamp rectifier 21, current also flows through LTDS regulator diode 39 until the voltage across capacitor 329 becomes close to zero level. When, after resetting the voltage on clamp capacitor 22 switching transistor 2329 is turned off, then LTDS input 2319*b* of two-input hysteresis circuit 2319 becomes active and monitors high voltage. Then the chopper circuit (transistor 2316 and resistor 2317) becomes active again and reset the LTDS voltage. In this way, the DC voltage level on semiconductor switch 10 is reset to that LTDS voltage by LTDS regulator diode 39. A similar operation can be observed in the second clamp.

When the leakage current through semiconductor switch 15 and other semiconductor switches in a series connection is higher than that through semiconductor switch 10, then the additional current flows through LTDS regulator diode 39, and charge capacitor 329 again. Upon reaching the upper hysteresis level of the LTDS input 2319*b* of two-input hysteresis circuit 2319, transistor 2316 turns on again and reset the voltage. In such a way, two-input hysteresis circuit 2319 maintains the LTDS voltage and controls the DC voltage level on semiconductor switch 10.

According to the above embodiment, the following advantages are observed.

1. High voltage filter capacitor 2318 or 6318 has been omitted resulting in lower system size, reduced cost and improved reliability.

2. Current voltage regulator 232 or 632 has been simplified. Loss in that circuit has become very small. Low cost and small current IGBTs can be applied.

3. Current limiting LTDS regulator 32 or 72 has been simplified.

4. Cooling has been simplified, since loss is concentrated to a single element, that is resistor 2317 or 6317.

Figure 31:
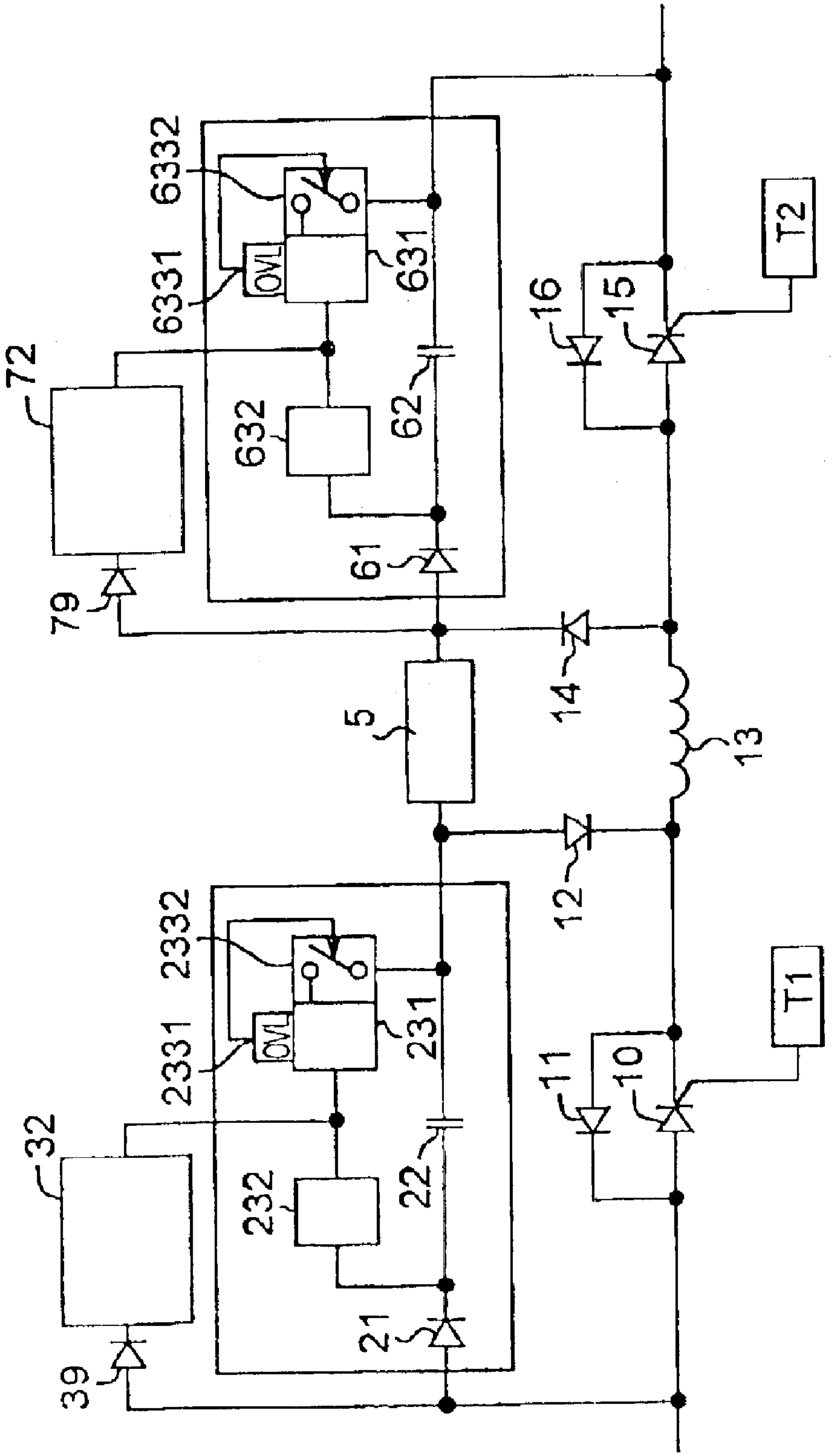
FIG. 31 is a circuit diagram similar to FIG. 21, but showing protection circuits for the first and second clamps.

FIG. 31 shows overload detection circuit 2331 or 6331 which is used to protect the main regulator. Depending on the type of circuit used in the main regulator 231 or 631, different arrangements are considered for detecting overload. Such arrangement is for example to detect temperature or to detect energy dissipation in the clamp. Upon detection of overload, the main regulator will be turned off by a turn-off circuit 2332 or 6332.

Figure 32:
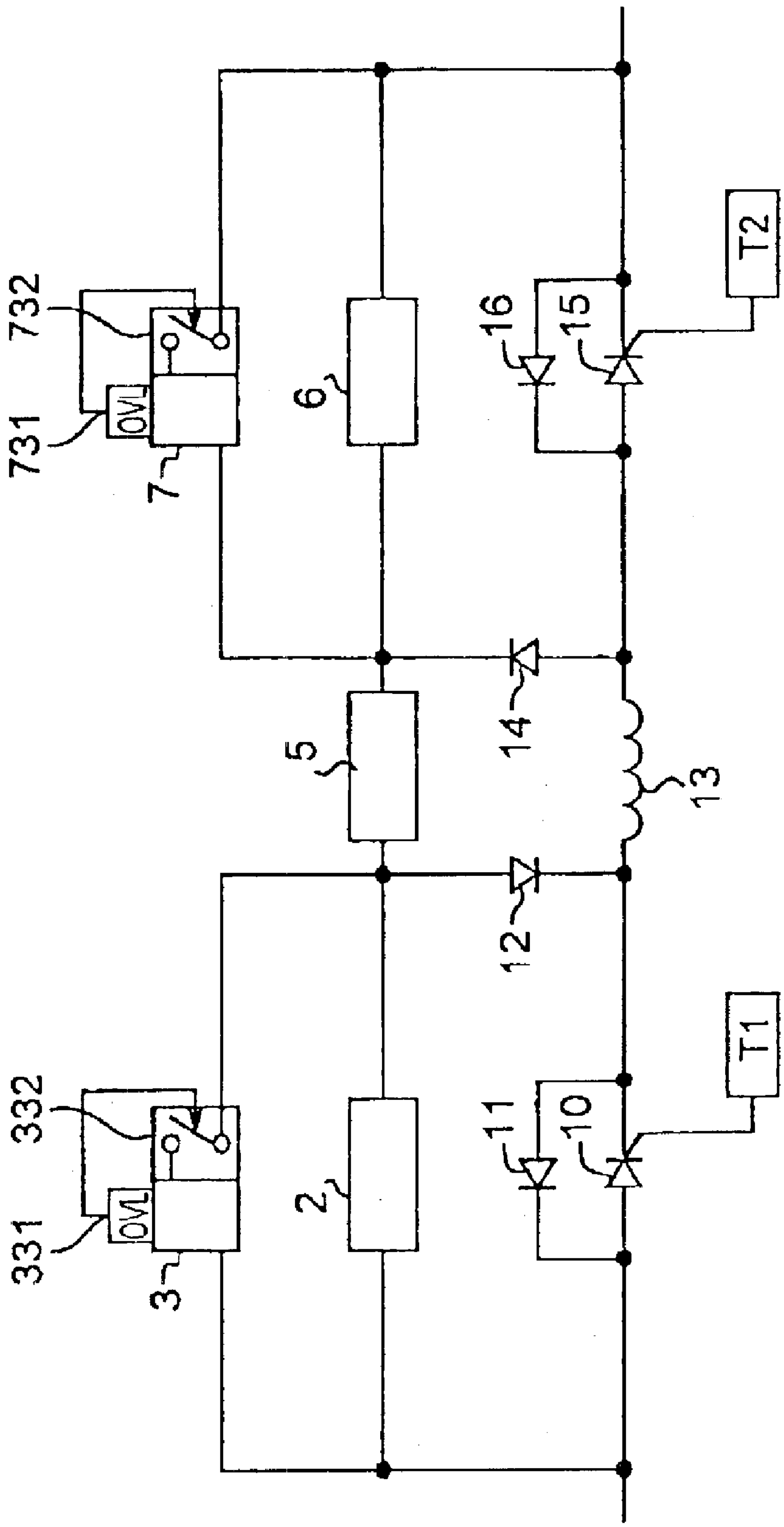
FIG. 32 is a circuit diagram similar to FIG. 21, but showing protection circuit or the LTDS regulators.

FIG. 32 shows a protection circuit for the first clamp defined by an overload circuit 331 and LTDS turn off circuit 332. Similarly, for the second clamp, a protection circuit includes an overload circuit 731 and LTDS turn-off circuit 732. Depending on the circuit chosen for the LTDS regulator, overload detection circuit can be formed by a temperature sensor or by a current monitor.

Using high voltage IGBTs in the position of the semiconductor switches 10 or 15 of the building block results in a very simple and reliable gate drive circuit, which only has to switch the IGBT on and off. Then, low IGBT switching loss is achieved, resulting in high power handling capability at reduced cost.

GCT or RCGCT are particularly suited for the position of the semiconductor switches 10 and 15 of the building block. Due to low on-state loss, low switching loss and very high power capability using GCTs or RCGCTs will result in very high power handling capability, very high efficiency and very high reliability.

SiC power semiconductor elements are very useful for fast, low loss high voltage switching. With such elements it seems mandatory to omit any parasitic loss in the semiconductor, since it would significantly degrade the design. Efficient dI/dt control and over voltage protection is a means to cut parasitic switching loss to a minimum. Application of SiC semiconductor switches to the building blocks therefore is expected to result in extremely high performance.

According to the present invention, clamps can be formed with a simple circuitry. The voltage applied across the building block, which is the switching unit, may not be concentrated in a particular circuit element, but can be separated in different circuit elements, so as to protect the circuit elements from receiving over the breakdown voltage.

According to the present invention, the voltage applied to the building block can be divided between the first semiconductor switch and the second semiconductor switch at a limited voltage.

According to the present invention, the energy cumulated during the switching delay between the first and second semiconductor switches can be dissipated by the energy management element.

According to the present invention, snubber circuits are provided to reduce the excessive current and voltage during the transient.

According to the present invention, the LTDS regulators are provided to regulate the voltage across the semiconductor switches below the value of LTDS specification.

According to the present invention, the rectifiers are formed by at least two diodes so that the voltage applied across each diode can be reduced.

According to the present invention, the LTDS regulator regulates both current and voltage.

According to the present invention, voltage limiting diodes and LTDS regulators will be protected against catastrophic disruption in case of a failure.

According to the present invention, overload detection circuits are provided to detect overload of the current and to shut down the circuit when the overload is detected to prevent the circuit from breakdown.

What is claimed is:

1. A building block for series connection in high power voltage source converters, comprising:

a first semiconductor switch with anti-parallel diode, a reactor, a second semiconductor switch with anti-parallel diode, said first semiconductor switch, said reactor, and said second semiconductor switch being connected in series, a first clamp having a voltage limiting function, a first reset diode, said first clamp and said first reset diode being connected in series to define a first series circuit, said first series circuit connected in parallel with said first semiconductor switch, a second clamp having a voltage limiting function, a second reset diode, said second clamp and said second reset diode being connected in series to define a second series circuit, said second series circuit being connected in parallel with said second semiconductor switch, and an energy management element connected between said first and second clamps.

2. The building block according to claim 1, wherein each of said first and second clamps comprises:

a clamp rectifier comprising at least one diode, a clamp capacitor connected in series to said clamp rectifier, and a clamp voltage regulator connected parallel with said clamp capacitor.

3. The building block according to claim 1, wherein each of said first and second clamps comprises a voltage limiting diode.

4. A building block according to claim 1, wherein said energy management element comprises:

an energy management resistor and an energy management capacitor.

5. A building block according to claim 2, further comprising:

a first snubber including a series connection of a first snubber resistor and a first snubber capacitor, said first snubber being connected in parallel with said first clamp rectifier, and a second snubber including a series connection of a second snubber resistor and a second snubber capacitor, said second snubber being connected in parallel with said second clamp rectifier.

6. The building block according to claim 1, further comprising:

a first long term d.c. stability (LTDS) regulator for regulating voltage of first semiconductor switch during off-state, and a second LTDS regulator for regulating the voltage of said second semiconductor switch during off-state.

7. The building block according to claim 6, wherein each of said first and second clamps comprises a first rectifier diode and a second rectifier diode; and each of said first and second LTDS regulators has a first end connected to a junction between said and second rectifier diodes.

8. The building block according to claim 6, wherein each of said first and second LTDS regulators comprises a voltage limiting LTDS regulator and a current limiting LTDS regulator.

9. The building block according to claim 2, wherein each of said first and second clamp voltage regulators comprises:

a main voltage regulator set to a voltage not exceeding a long term d.c. stability (IDS) voltage rating of the respective semiconductor switch, and a current-voltage regulator, set to a difference between a predetermined clamp voltage and a voltage setting of the main voltage regulator, and said building block further comprises a first current limiting long term d.c. stability (LTDS) regulator, a first LTDS regulator diode, a second current limiting LTDS regulator, and a second LTDS regulator diode.

10. The building block according to claim 9, wherein each of said first and second rectifiers comprises a first rectifier diode and a second rectifier diode; and first and second current limiting LTDS regulators are connected to a junction between said first and second rectifier diodes.

11. The building block according to claim 9, wherein each of said first and second current limiting LTDS regulators comprises at least a LTDS resistor.

12. The building block according to claim 9, wherein each of said first and second current limiting LTDS regulators comprises at least a current limiting semiconductor circuit.

13. The building block according to claim 9, wherein each of said first and second main voltage regulators comprises an analog control circuit.

14. The building block according to claim 9, wherein each of said first and second main voltage regulators comprises a parallel connection of a chopper circuit and a filter capacitor.

15. The building block according to claim 9, wherein said current-voltage regulator comprises an analog control circuit.

16. The building block according to claim 9, wherein said current-voltage regulator comprises a chopper circuit.

17. The building block according to claim 9, wherein each of said first and second main voltage regulators further comprises a blocking capability, which is at least as high as the blocking capability of said first and second semiconductor switches.

18. A building block according to claim 6, wherein said at least one diode is at least capable to conduct the full current after failure, and said LTDS regulator has a blocking capability, which is at least as high as the blocking capability of said at least one diode or said first and second semiconductor switches or anti-parallel diodes, whichever is smaller.

19. The building block according to claim 17, wherein each of said first and second main voltage regulators further comprises:

a overload detection circuit, which detects overload condition of the main voltage regulator, and a turn off circuit, which turn off said main voltage regulator upon detection of overload of said main voltage regulator.

20. The building block according to claim 18, wherein said LTDS regulator further comprises.

a LTDS overload detection circuit which detects overload condition of said LTDS regulator, said an LTDS turn off circuit, which turn off said LTDS regulator upon detection of the overload.

* * * * *